(12) United States Patent
Hitora et al.

(10) Patent No.: US 11,069,781 B2
(45) Date of Patent: *Jul. 20, 2021

(54) CRYSTALLINE SEMICONDUCTOR FILM, PLATE-LIKE BODY AND SEMICONDUCTOR DEVICE

(71) Applicant: FLOSFIA INC., Kyoto (JP)

(72) Inventors: Toshimi Hitora, Kyoto (JP); Masaya Oda, Kyoto (JP); Akio Takatsuka, Kyoto (JP)

(73) Assignee: FLOSFIA INC., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/534,318

(22) Filed: Aug. 7, 2019

(65) Prior Publication Data

US 2020/0144376 A1 May 7, 2020

Related U.S. Application Data

(63) Continuation of application No. 15/320,253, filed as application No. PCT/JP2015/070752 on Jul. 21, 2015, now Pat. No. 10,439,028.

(30) Foreign Application Priority Data

Jul. 22, 2014 (JP) ................................. 2014-149313
Jun. 22, 2015 (JP) ................................. 2015-125189

(51) Int. Cl.
*H01L 29/24* (2006.01)
*H01L 21/02* (2006.01)
(Continued)

(52) U.S. Cl.
CPC .......... *H01L 29/24* (2013.01); *H01L 21/0242* (2013.01); *H01L 21/0262* (2013.01);
(Continued)

(58) Field of Classification Search
CPC ................ H01L 29/24; H01L 21/0242; H01L 21/02565; H01L 29/267; H01L 29/812
See application file for complete search history.

(56) References Cited

U.S. PATENT DOCUMENTS 7,951,639 B2  5/2011  Chua et al.
9,045,844 B2  6/2015  Iwai et al.
(Continued)

FOREIGN PATENT DOCUMENTS

CN  103918082 A  7/2014
CN  105097957 A  11/2015
(Continued)

OTHER PUBLICATIONS

English Transtaion of JP-2013058637-A (Year: 2013).*
(Continued)

*Primary Examiner* — Changhyun Yi
(74) *Attorney, Agent, or Firm* — Christensen O'Connor Johnson Kindness PLLC

(57) ABSTRACT

A semiconductor film, a sheet like object, and a semiconductor device are provided that have inhibited semiconductor properties, particularly leakage current, and excellent withstand voltage and heat dissipation. A crystalline semiconductor film or a sheet like object includes a corundum structured oxide semiconductor as a major component, wherein the film has a film thickness of 1 μm or more. Particularly, the semiconductor film or the object includes a semiconductor component of oxide of one or more selected from gallium, indium, and aluminum as a major component. A semiconductor device has a semiconductor structure including the semiconductor film or the object.

20 Claims, 35 Drawing Sheets

(51) Int. Cl.

| | |
|---|---|
| *H01L 29/66* | (2006.01) |
| *H01L 29/772* | (2006.01) |
| *H01L 29/808* | (2006.01) |
| *H01L 29/78* | (2006.01) |
| *H01L 29/872* | (2006.01) |
| *H01L 29/04* | (2006.01) |
| *H01L 29/739* | (2006.01) |
| *H01L 29/778* | (2006.01) |
| *H01L 29/812* | (2006.01) |
| *H01L 33/44* | (2010.01) |
| *H01L 33/26* | (2010.01) |
| *H01L 33/00* | (2010.01) |

(52) U.S. Cl.
CPC .. *H01L 21/02565* (2013.01); *H01L 21/02573* (2013.01); *H01L 21/02628* (2013.01); *H01L 29/04* (2013.01); *H01L 29/66969* (2013.01); *H01L 29/739* (2013.01); *H01L 29/7395* (2013.01); *H01L 29/778* (2013.01); *H01L 29/7722* (2013.01); *H01L 29/7787* (2013.01); *H01L 29/78* (2013.01); *H01L 29/7827* (2013.01); *H01L 29/8083* (2013.01); *H01L 29/812* (2013.01); *H01L 29/8122* (2013.01); *H01L 29/872* (2013.01); *H01L 29/8725* (2013.01); *H01L 33/005* (2013.01); *H01L 33/26* (2013.01); *H01L 33/44* (2013.01)

(56) References Cited

U.S. PATENT DOCUMENTS

| | | | |
|---|---|---|---|
| 9,171,967 B2 | 10/2015 | Takizawa | |
| 9,379,190 B2 | 6/2016 | Hitora et al. | |
| 9,412,882 B2 | 8/2016 | Takizawa et al. | |
| 9,711,590 B2 | 7/2017 | Kaneko et al. | |
| 10,161,058 B2 | 12/2018 | Sasaki | |
| 10,439,028 B2* | 10/2019 | Hitora | H01L 29/778 |
| 2007/0235768 A1 | 10/2007 | Nakazawa | |
| 2009/0239354 A1 | 9/2009 | Suzawa et al. | |
| 2010/0038638 A1 | 2/2010 | Tao et al. | |
| 2010/0102309 A1 | 4/2010 | Nakahara et al. | |
| 2013/0112991 A1 | 5/2013 | Hong et al. | |
| 2014/0217405 A1 | 8/2014 | Sasaki et al. | |
| 2014/0217470 A1 | 8/2014 | Sasaki et al. | |
| 2014/0217471 A1* | 8/2014 | Sasaki | H01L 29/812 |
| | | | 257/192 |
| 2015/0194479 A1 | 7/2015 | Kaneko et al. | |
| 2015/0225843 A1 | 8/2015 | Oda et al. | |
| 2015/0279927 A1 | 10/2015 | Hitora | |
| 2015/0325660 A1 | 11/2015 | Hitora | |
| 2016/0017512 A1 | 1/2016 | Sasaki | |
| 2016/0211386 A1 | 7/2016 | Tomai et al. | |

FOREIGN PATENT DOCUMENTS

| | | |
|---|---|---|
| EP | 2927934 A1 | 10/2015 |
| EP | 2942804 A1 | 11/2015 |
| JP | 2009-167057 A | 7/2009 |
| JP | 2012-243953 A | 12/2012 |
| JP | 2013-028480 A | 2/2013 |
| JP | 2013-058637 A | 3/2013 |
| JP | 2013058637 A * | 3/2013 |
| JP | 2013-070072 A | 4/2013 |
| JP | 2013-102081 A | 5/2013 |
| JP | 5343224 B1 | 8/2013 |
| JP | 5343224 B1 | 11/2013 |
| JP | 5397794 B1 | 11/2013 |
| JP | 5397795 B1 | 11/2013 |
| JP | 2014-072533 A | 4/2014 |
| JP | 5536920 B1 | 5/2014 |
| JP | 5528612 B1 | 6/2014 |
| JP | 5536920 B1 | 7/2014 |
| KR | 10-2009-0118947 A | 11/2009 |
| KR | 10-2010-0088076 A | 8/2010 |
| KR | 10-2011-0011402 A | 2/2011 |
| WO | 2006/001225 A1 | 1/2006 |
| WO | 2013/021804 A1 | 2/2013 |
| WO | 2013-035843 A1 | 3/2013 |
| WO | 2013/035844 A1 | 3/2013 |
| WO | 2013-035845 A1 | 3/2013 |

OTHER PUBLICATIONS

Korean Office Action dated Nov. 26, 2018, issued in Korean Application No. 10-2018-7030849, filed Jul. 21, 2015, 16 pages.

Extended European Search Report dated May 29, 2017, issued in corresponding European Application No. 15824091.1, filed Jul. 21, 2015, 7 pages.

International Search Report dated Oct. 6, 2015, issued in corresponding International Application No. PCT/JP2015/070752, filed Jul. 21, 2015, 3 pages.

Kaneko, K., "Growth and Properties of Corundum Structure Gallium Oxide-Based Mixed Crystal Thin Film", doctoral dissertation, Kyoto University, Kyoto, Mar. 2013, 120 pages.

Kumaran, R., "New Solid State Laser Crystals Created by Epitaxial Growth", doctoral dissertation, University of British Columbia, Vancouver, B.C., Canada, Sep. 2012, 190 pages.

Shinohara, D., and S. Fujita, "Heteroeptiaxy of Corundum-Structured $\alpha$-$Al_2O_3$ Substrates by Ultrasonic Mist Chemical Vapor Deposition," Japanese Journal of Applied Physics 47(9):7311-7313, Sep. 2008.

Japanese Office Action dated Aug. 23, 2019, issued in Japanese Application No. 2018-204424, filed Oct. 30, 2018, 3 pages.

Office Action dated Feb. 9, 2021, issued in Japanese Application No. 2020-036318, filed Aug. 8, 2019, 3 pages.

Office Action dated Feb. 19, 2021, issued in Chinese Application No. 201810759140.5, filed Jul. 21, 2015, 11 pages.

Office Action dated Apr. 20, 2021, issued in Japanese Application no. 2020-007984, filed Jul. 10, 2018, 6 pages.

* cited by examiner

CRYSTALLINE SEMICONDUCTOR FILM, PLATE-LIKE BODY AND SEMICONDUCTOR DEVICE

TECHNICAL FIELD

The present invention relates to a crystalline semiconductor film and a sheet like object that are useful for a semiconductor device and a semiconductor device using the crystalline semiconductor film or the sheet like object.

BACKGROUND ART

As a switching device of the next generation achieving high withstand voltage, low losses, and high temperature resistance, semiconductor devices using gallium oxide ($Ga_2O_3$) with a large band gap attract attention and are expected to be applied to power semiconductor devices, such as an inverter. According to NPL 1, such gallium oxide has a band gap that may be controlled by forming mixed crystal with indium or aluminum singly or in combination. Among all, InAlGaO-based semiconductors represented by $In_xAl_yGa_zO_3$ ($0 \leq X' \leq 2$, $0 \leq Y' \leq 2$, $0 \leq Z' \leq 2$, $X'+Y'+Z'=1.5$ to 2.5) are extremely attractive materials.

PTL 1 describes a highly crystalline conductive $\alpha$-$Ga_2O_3$ thin film with an added dopant (tetravalent tin). The thin film in PTL 1 is, however, not capable of maintaining sufficient withstand voltage. This film also contains many carbon impurities and has unsatisfactory semiconductor properties including conductivity, so that the film is difficult to be used for a semiconductor device.

PTL 2 describes a $Ga_2O_3$-based semiconductor element with a p type $\alpha$-$(Al_{x''}Ga_{1-x''})_2O_3$ single crystal film formed on an $\alpha$-$Al_2O_3$ substrate. The semiconductor element in PTL 2, however, has many constraints to be applied to a semiconductor element due to $\alpha$-$Al_2O_3$ being an insulator and the crystal quality with some problems. The MBE technique requires ion implantation and heat treatment at high temperatures to obtain a p type semiconductor. The p type $\alpha$-$Al_2O_3$ itself is accordingly difficult to be achieved, and in reality, the semiconductor element in PTL 2 itself is difficult to be achieved.

NPL 2 also describes that an $\alpha$-$Ga_2O_3$ thin film can be formed on sapphire by the MBE technique. The description, however, mentions that the crystal grows up to a film thickness of 100 nm at a temperature of 450° C. or less while the quality of the crystal becomes poor with a film thickness more than that and a film with a film thickness of 1 μm or more cannot be obtained.

There is therefore an expectation of an $\alpha$-$Ga_2O_3$ thin film with a film thickness of 1 μm or more and having undegraded crystal quality.

PTL 3 describes a method of manufacturing a crystalline oxide thin film by mist CVD using bromide or iodide of gallium or indium.

PTLs 4 to 6 describe a multilayer structure having a semiconductor layer with a corundum crystal structure and an insulating film with a corundum crystal structure, both laminated on a base substrate with a corundum crystal structure.

PTLs 3 to 6 are publications on patents or patent applications by the present applicant, and at the time of each application, a crystalline thin film having a film thickness of 1 μm or more was not yet able to be obtained. In addition, all films obtained in the methods of PTLs 3 to 6 were not able to be peeled off from the substrate in reality.

CITATION LIST

Patent Literature

PTL 1: JP 2013-28480A
PTL 2: JP 2013-58637A
PTL 3: Japanese Patent No. 5397794
PTL 4: Japanese Patent No. 5343224
PTL 5: Japanese Patent No. 5397795
PTL 6: JP 2014-72533A

Non Patent Literature

NPL 1: Kaneko, Kentaro, "Fabrication and physical properties of corundum structured alloys based on gallium oxide", Dissertation, Kyoto Univ., March 2013
NPL 2: Raveen Kumaran, "New Solid State Laser Crystals Created by Epitaxial Growth", A thesis submitted for the degree of doctor of philosophy, The University of British Columbia, September 2012

SUMMARY OF THE INVENTION

Technical Problem

It is an object of the present invention to provide a semiconductor film, a sheet like object, and a semiconductor device that have inhibited semiconductor properties, particularly leakage current, and have excellent withstand voltage and heat dissipation.

Solution to Problem

As a result of keen examination to achieve the object, the present inventors have successfully invented a crystalline semiconductor film, including a corundum structured oxide semiconductor as a major component, wherein the film has a film thickness of 1 μm or more.

In addition, the present inventors have made further research to successfully manufacture a sheet like object, including a corundum structured oxide semiconductor as a major component.

Still in addition, the present inventors manufactured a semiconductor device using the crystalline semiconductor film or the sheet like object and found that the semiconductor device thus obtained had inhibited leakage current and had excellent withstand voltage and heat dissipation, and after learning the above various findings, have made further research to complete the present invention.

Advantageous Effects of Invention

The crystalline semiconductor film and the sheet like object of the present invention are excellent in semiconductor properties and the semiconductor device of the present invention has inhibited leakage current and is excellent in withstand voltage and heat dissipation.

DESCRIPTION OF EMBODIMENTS

Figure 1:
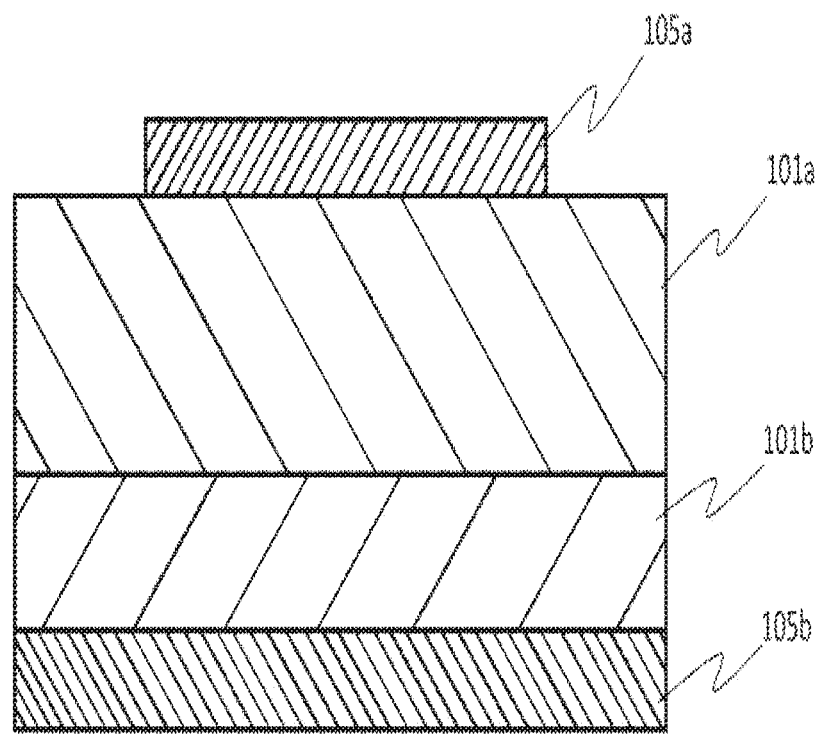
FIG. 1 is a diagram schematically illustrating a preferred example of a Schottky barrier diode (SBD) of the present invention.

A crystalline semiconductor film of the present invention is a crystalline semiconductor film, including a corundum structured oxide semiconductor as a major component, and the crystalline semiconductor film is not particularly limited as long as the film has a film thickness of 1 μm or more. In the present invention, the film thickness is preferably 2 μm or more, more preferably 3 μm or more, and most preferably 5 μm or more. In the present invention, the semiconductor film preferably has a film thickness of 7.6 μm or more. A film thickness of 7.6 μm or more enables free standing of the crystalline semiconductor film. In the present invention, the film more preferably has a film thickness of 10 μm or more and is most preferably a multilayer film having a film thickness of 10 μm or more, in which the layers contain the same major component (e.g., a laminate of an n− type semiconductor layer and an n+ type semiconductor layer) because the semiconductor properties are improved more. The shape of the crystalline semiconductor film is not particularly limited, but may be a quadrangular, circular, or polygonal or the like. The surface area of the crystalline semiconductor film in the present invention is not particularly limited, but preferably 3 mm square or more (9 mm$^2$ or more), more preferably 5 mm square or more (25 mm$^2$ or more), and most preferably a diameter of 50 mm or more. In the present invention, use of mist CVD in specific conditions enables easy production of the crystalline semiconductor film of 3 mm square or more, which has not been achieved conventionally.

The crystalline semiconductor film may be a single crystal film or may be a polycrystalline film. In the present invention, the crystalline semiconductor film is preferably a single crystal film that may contain polycrystal. The oxide semiconductor is not particularly limited as long as the semiconductor is a corundum structured oxide semiconductor. Examples of the oxide semiconductor include a metal oxide semiconductor or the like containing one or more types of metal selected from Al, Ga, In, Fe, Cr, V, Ti, Rh, Ni, and Co and the like. In the present invention, the oxide semiconductor preferably contains one or more elements selected from indium, aluminum, and gallium as major components, more preferably contains at least indium or/and gallium as major components, and most preferably contains at least gallium as a major component. In the present invention, "containing as a major component" means to contain the corundum structured oxide semiconductor at an atomic ratio of preferably 50% or more based on the entire components of the crystalline semiconductor film, more preferably 70% or more, and even more preferably 90% or more, and also means that the semiconductor may be contained at 100%.

In the present invention, the oxide semiconductor is preferably a type $In_xAl_yGa_zO_3$ ($0 \leq X \leq 2$, $0 \leq Y \leq 2$, $0 \leq Z \leq 2$, $X+Y+Z=1.5$ to $2.5$ and $0<X$ or $0<Z$). Preferred composition of a type $In_xAl_yGa_zO_3$ as the oxide semiconductor is not particularly limited as long as the objects of the present invention are not impaired. A total atomic ratio of gallium, indium, and aluminum in the metal elements contained in the crystalline semiconductor film is preferably 0.5 or more and more preferably 0.8 or more. Preferred composition of the oxide semiconductor containing gallium is preferably at an atomic ratio of gallium of 0.5 or more in the metal elements contained in the crystalline semiconductor film and more preferably 0.8 or more.

In the crystalline semiconductor film, a dopant may be contained. The dopant is not particularly limited as long as the objects of the present invention are not impaired. Examples of the dopant include n type dopants, such as tin, germanium, silicon, titanium, zirconium, vanadium, and niobium, p type dopants, or the like. The dopant concentration may be generally approximately from $1 \times 10^{16}$/cm$^3$ to $1 \times 10^{22}$/cm$^3$. The dopant concentration may be at low concentration of, for example, approximately $1 \times 10^{17}$/cm$^3$ or less to make an n− type semiconductor or the like in the case of, for example, an n type dopant. Further, according to the present invention, the dopant may be contained at high concentration of approximately $1 \times 10^{20}$/cm$^3$ or more to make an n+ type semiconductor or the like in the case of, for example, an n type dopant. In the present invention, the n type dopant is preferably germanium, silicon, titanium, zirconium, vanadium, or niobium. For formation of an n− type semiconductor layer, the concentration of germanium, silicon, titanium, zirconium, vanadium, or niobium in the crystalline semiconductor film is preferably approximately from $1 \times 10^{13}$ to $5 \times 10^{17}$/cm$^3$ and more preferably approximately from $1 \times 10^{15}$ to $1 \times 10^{17}$/cm$^3$. For formation of an n+ type semiconductor layer using germanium, silicon, titanium, zirconium, vanadium, or niobium as the n type dopant, the concentration of germanium, silicon, titanium, zirconium, vanadium, or niobium in the crystalline semiconductor film is preferably approximately from $1 \times 10^{20}$/cm$^3$ to $1 \times 10^{23}$/cm$^3$ and more preferably approximately from $1 \times 10^{20}$/cm$^3$ to $1 \times 10^{21}$/cm$^3$. Germanium, silicon, titanium, zirconium, vanadium, or niobium is thus contained in the crystalline semiconductor film to make a crystalline semiconductor film more excellent in electrical characteristics than the case of using tin as the dopant.

The crystalline semiconductor film may be formed directly on a base substrate or may be formed via another layer. Examples of such another layer include a corundum structured crystalline thin film of another composition, a crystalline thin film with of a structure other than the corundum structure, an amorphous thin film, or the like. The structure may be a single layer structure or may be a multilayer structure. One layer may have two or more crystal phases mixed therein. In the case of having a multilayer structure, the crystalline semiconductor film in the present invention is configured by laminating, for example, an insulating thin film and a conductive thin film, but not limited. In the multilayer structure configured by laminating an insulating thin film and a conductive thin film, the insulating thin film and the conductive thin film may have the same composition or compositions different from each other. The thickness ratio of the conductive thin film to the insulating thin film is not particularly limited, and the ratio of (thickness of the conductive thin film)/(thickness of the insulating thin film) is preferably, for example, from 0.001 to 100 and more preferably from 0.1 to 5. The more preferred ratio is specifically, for example, 0.1, 0.2, 0.3, 0.4, 0.5, 0.6, 0.7, 0.8, 0.9, 1, 1.1, 1.2, 1.3, 1.4, 1.5, 1.6, 1.7, 1.8, 1.9, 2, 3, 4, and 5 and may range between any two values listed here.

Figure 19A:
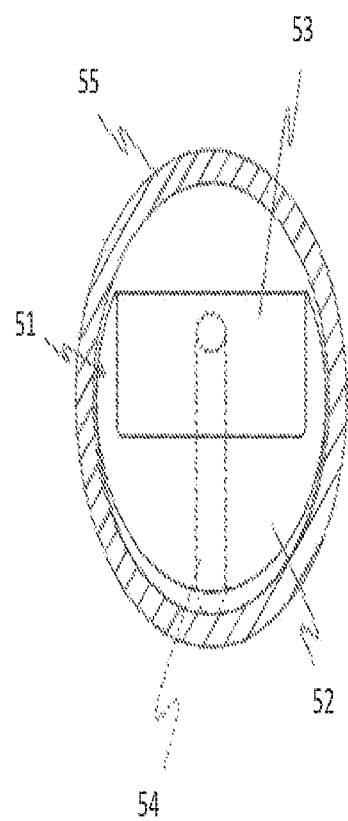
FIGS. 19A to 19B show diagrams illustrating a susceptor used in Example.
Figure 19B:
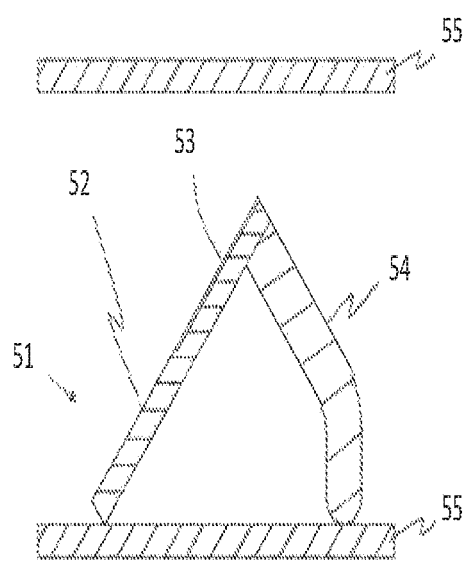
Figure 20:
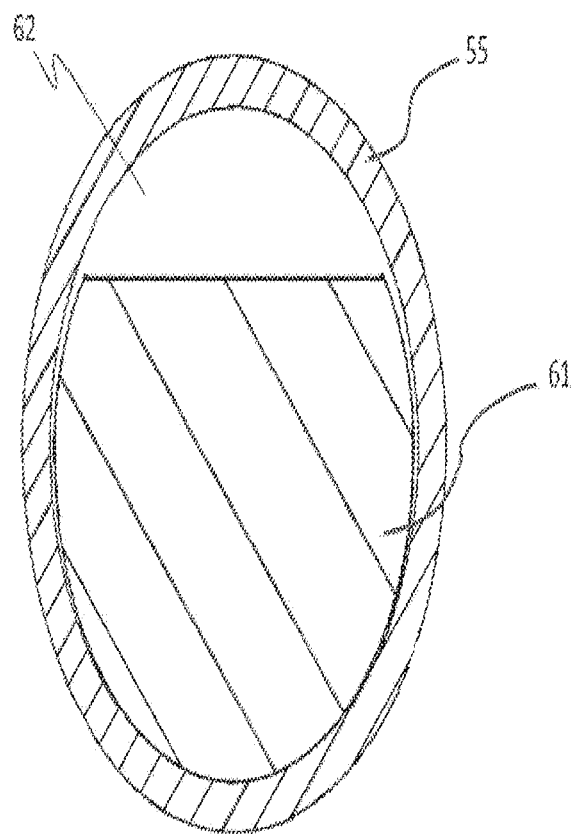
FIG. 20 is a diagram illustrating relationship between cross sectional areas of the susceptor and a supply pipe used in Example.

In the present invention, by mist CVD using, for example, a susceptor illustrated in FIGS. 19A to 19B and 20, an abnormal grain inhibitor, or the like, the crystalline semiconductor film may be laminated directly on the base substrate or via another layer.

<Base Substrate>

The base substrate is not particularly limited as long as it becomes a support for the crystalline semiconductor film. While the base substrate may be an insulating substrate, a semiconductor substrate, or a conductive substrate, it is preferably an insulating substrate and also preferably a substrate having a metal film on a surface. In the present invention, the base substrate is also preferably a substrate containing corundum structured crystals as a major component or a substrate containing β-gallic structured crystals as a major component. The substrate containing corundum structured crystals as a major component is not particularly limited as long as the substrate contains corundum structured crystals at a composition ratio in the substrate of 50% or more. In the present invention, the crystals are preferably contained at 70% or more and more preferably at 90% or more. Examples of the substrate containing corundum structured crystals as a major component include a sapphire substrate (e.g., c-plane sapphire substrate), an a type gallium oxide substrate, or the like. The substrate containing β-gallic structured crystals as a major component is not particularly limited as long as the substrate contains the β-gallic structured crystals at a composition ratio in the substrate of 50% or more. In the present invention, the crystals are preferably contained at 70% or more and more preferably at 90% or more. Examples of the substrate containing β-gallic structured crystals as a major component include a β-$Ga_2O_3$ substrate, a mixed crystal substrate containing $Ga_2O_3$ and $Al_2O_3$ where $Al_2O_3$ is more than 0 wt% and 60 wt% or less, or the like. Examples of other base substrates include hexagonal structured substrates (e.g., SiC substrate, ZnO substrate, GaN substrate), or the like. The crystalline semiconductor film is preferably formed directly on the hexagonal structured substrate or via another layer (e.g., buffer layer, etc.). The thickness of the base substrate in the present invention is not particularly limited, but preferably from 50 to 2000 μm and more preferably from 200 to 800 μm.

In the case of the base substrate having a metal film on a surface, the metal film may be provided on all or part of a substrate surface and the metal film may be provided in a mesh or dotted form. The thickness of the metal film is not particularly limited, but preferably from 10 to 1000 nm and more preferably from 10 to 500 nm. Examples of the component material for the metal film include metal, such as platinum (Pt), gold (Au), palladium (Pd), silver (Ag), chromium (Cr), copper (Cu), iron (Fe), tungsten (W), titanium (Ti), tantalum (Ta), niobium (Nb), manganese (Mn), molybdenum (Mo), aluminum (Al), and hafnium (Hf), alloys thereof, or the like. The metal is preferably uniaxially oriented. The uniaxially oriented metals include any metals whose crystal orientation is directed to a specific direction (the film thickness direction and the film in-plane direction, the film thickness direction), and include metals which are oriented preferentially to one axis. In the present invention, the orientation is preferably uniaxial in the film thickness direction. Whether the orientation is uniaxial may be confirmed by X-ray diffraction. For example, the uniaxial orientation may be determined when an integrated intensity ratio of a peak derived from a uniaxially oriented crystal face to a peak derived from another crystal face is greater (preferably not less than twice greater and more preferably not less than an order of magnitude greater) compared with an integrated intensity ratio of a peak derived from a uniaxially oriented crystal face of randomly oriented powder of the same crystal to a peak derived from another crystal face.

In the present invention, the base substrate is preferably a sapphire substrate (e.g., c-plane sapphire substrate), an a type gallium oxide substrate, a β-$Ga_2O_3$ substrate, a mixed crystal substrate containing $Ga_2O_3$ and $Al_2O_3$ where $Al_2O_3$ is more than 0 wt % and 60 wt % or less, or any of these substrates having a metal film formed on a surface. Use of such a preferred base substrate enables more reduction in the carbon content ratio, the carrier concentration, and the half width of the impurities in the crystalline semiconductor film compared with the case of using another base substrate.

The mist CVD is not particularly limited as long as the film formation method includes, (1) a step of atomizing a raw material, for example, using an ultrasonic vibration transducer to produce mist, (2) a step of supplying a carrier gas, and (3) a step of delivering the mist to the base substrate retained by the susceptor with the carrier gas for film formation. More specific examples of the method of producing mist include mist epitaxy, mist CVD, or the like.

The step (1) is not particularly limited as long as a raw material is atomized to produce mist. For the step (1), a mist generator may be used that atomizes the raw material to produce mist. The mist generator is not particularly limited as long as the generator is capable of atomizing the raw material to produce mist. The generator may be a known one while, in the present invention, the generator preferably atomizes the raw material to produce mist using ultrasonic waves. The raw material is described later.

The step (2) is not particularly limited as long as a carrier gas is supplied. The carrier gas is not particularly limited as long as it is gaseous and capable of delivering the mist produced by atomizing the raw material onto a substrate. Examples of the carrier gas are not particularly limited, but include an oxygen gas, a nitrogen gas, an argon gas, a forming gas, or the like.

The step (3) is not particularly limited as long as the mist is delivered to the base substrate retained by a susceptor using the carrier gas for film formation. For the step (3), a tube furnace may be preferably used that is capable of delivering the mist to the substrate using the carrier gas for film formation in the supply pipe.

In the present invention, for film formation in the supply pipe in the step (3), the crystalline semiconductor film is preferably formed using a susceptor illustrated in, for example, FIGS. 19 and 20 as the susceptor mentioned above.

FIGS. 19A to 19B illustrate an embodiment of the susceptor. A susceptor 51 illustrated in FIGS. 19A to 19B is provided with a mist accelerator 52, a substrate holder 53, and a support unit 54. The support unit 54 is in a rod shape and configured to have a contact angle of the support unit 54 with a supply pipe 55 of approximately 90° by changing the angle of the unit at some point. Although such configuration improves the stability of the susceptor 51, the shape of the support unit 54 in the present invention is not particularly limited and various shapes may be applied as appropriate.

FIG. 19A illustrates a cross section inside the supply pipe toward the substrate in the direction from upstream to downstream of the mist. It is seen from the drawing that the substrate-side surface of the susceptor has an outer circumference in a semicircular shape, which is a shape approximately identical to the inner circumference of the supply pipe. FIG. 19B illustrates cross sections of the supply pipe, the substrate, and the susceptor taking the upstream of the mist on the left and the downstream on the right. Although the mist is prone to precipitate in the supply pipe due to its properties, the susceptor 51 is configured to have the inclined mist accelerator 52 to raise the precipitated mist by acceleration, thereby delivering the mist onto the substrate.

FIG. 20 illustrates, in the supply pipe 55, a region for the susceptor and the substrate illustrated in FIGS. 19A to 19B as a substrate-susceptor region 61 and a region to exhaust unreacted mist as an exhaust region 62, showing the relationship between a total area of the susceptor and the substrate and an area of the exhaust region. In the present invention, as illustrated in FIG. 20, in the cross section inside the supply pipe divided into a susceptor region occupied by the susceptor, a region for the substrate, and the exhaust region to exhaust unreacted mist, the total area of the susceptor region and the substrate is preferably greater than the area of the exhaust region. Use of such a preferred susceptor enables acceleration of the mist on the substrate to obtain a more homogeneous and thicker crystalline semiconductor film.

For the crystalline semiconductor film formation, a dopant may be used to perform doping. In the present invention, doping is generally performed by incorporating an abnormal grain inhibitor into the raw material. The doping by incorporating an abnormal grain inhibitor into the raw material enables production of a crystalline semiconductor film excellent in surface smoothness. The amount of doping is not particularly limited as long as the objects of the present invention are not impaired, and preferably at a molar ratio from 0.01 to 10% in the raw material and more preferably from 0.1 to 5%.

The abnormal grain inhibitor means to have an effect of inhibiting by-product particles in the film formation process. The inhibitor is not particularly limited as long as the crystalline semiconductor film has a surface roughness (Ra) of, for example, 0.1 µm or less. In the present invention, the abnormal grain inhibitor is preferably made from at least one selected from Br, I, F, and Cl. For stable film formation, introduction of Br or I in the film as the abnormal grain inhibitor enables inhibition of deterioration of the surface roughness due to abnormal grain growth. Although the amount of the abnormal grain inhibitor is not particularly limited as long as abnormal grains are inhibited, the amount is preferably 50% or less at a volume ratio in a raw-material solution, more preferably 30% or less, and most preferably in a range from 1 to 30%. Use of the abnormal grain inhibitor in such a preferred range enables its function as an abnormal grain inhibitor, and the abnormal grain growth in the crystalline semiconductor film is thus inhibited to smooth the surface.

A method of forming a crystalline semiconductor film is not particularly limited as long as the objects of the present invention are not impaired. The film may be formed by reaction of a raw material by combining, for example, a gallium compound with an indium compound, an aluminum compound, or the like as desired in accordance with the composition of the crystalline semiconductor film. This enables crystal growth of the crystalline semiconductor film on the base substrate from the base substrate side. The gallium compound may be a product using gallium metal as starting material to be changed into a gallium compound immediately before film formation. Examples of the gallium compound include organic metal complexes (e.g., acetyl acetylacetonato complex, etc.), halides (e.g., fluoride, chloride, bromide, iodide, etc.), or the like of gallium, and in the present invention, a halide (e.g., fluoride, chloride, bromide, iodide, etc.) is preferably used. Film formation by mist CVD using a halide as the raw material compound enables substantial exclusion of carbon from the crystalline semiconductor film.

More specifically, the crystalline semiconductor film may be formed by supplying raw material microparticles generated from a raw-material solution in which a raw material compound is dissolved to a film formation chamber and reacting the raw material compound in the film formation chamber using the susceptor. The solvent of the raw-material solution is not particularly limited, but preferably water, a hydrogen peroxide solution, or an organic solvent. In the present invention, the raw material compound is generally reacted in the presence of a dopant raw material. The dopant raw material is preferably incorporated in the raw-material solution to be microparticulated together with or separately from the raw material compound. The amount of carbon contained in the crystalline semiconductor film is thus less than that in the dopant, and preferably carbon is not substantially contained in the crystalline semiconductor film. The crystalline semiconductor film of the present invention also preferably contains halogen (preferably Br) to form a good semiconductor structure. Examples of the dopant raw material include simple substances of metal, such as germanium, silicon, titanium, zirconium, vanadium, and niobium, compounds thereof (e.g., halides, oxides, etc.), or the like.

Film formation as above enables industrially advantageous production of a crystalline semiconductor film having a film thickness of 1 μm or more. In the present invention, the film thickness of 1 μm or more may be formed by appropriately adjusting film formation time.

In the present invention, annealing may be performed after film formation. The temperature for annealing is not particularly limited, but preferably 600° C. or less and more preferably 550° C. or less. Annealing at such a preferred temperature more preferably enables adjustment of the carrier concentration in the crystalline semiconductor film. While the annealing time is not particularly limited as long as the objects of the present invention are not impaired, the time is preferably from 10 seconds to 10 hours and more preferably from 10 seconds to 1 hour.

The base substrate may be peeled off from the crystalline semiconductor film. The peeling means is not particularly limited as long as the objects of the present invention are not impaired and may be known means. Examples of the peeling means include means of peeling by applying mechanical impact, means of peeling by applying heat to utilize thermal stress, means of peeling by applying vibration, such as ultrasonic waves, means of peeling by etching, or the like. Such peeling enables production of the crystalline semiconductor film as a free-standing film.

For the base substrate having a metal film formed on a surface, peeling may be subjected only to the substrate portion and the metal film may remain on the semiconductor layer surface. The metal film remained on the semiconductor layer surface enables facilitation and improvement of electrode formation on the semiconductor surface.

The film formation may be repeated, and the repeat of film formation allows the film thickness to be thicker and also enables production of a sheet like object containing the corundum structured oxide semiconductor as a major component. In the present invention, a crystalline semiconductor film may be formed again on the free-standing film.

In the present invention, the above film formation enables production of a sheet like object having a thickness of 7.6 μm or more, preferably 10 μm or more, more preferably 15 μm or more, and most preferably 50 μm or more. The sheet like object is allowed to be used not only as a semiconductor layer but also as a substrate.

The crystalline semiconductor film and the sheet like object have a semiconductor structure useful for a semiconductor device. In the present invention, the crystalline semiconductor film or the sheet like object may be used for a semiconductor device as a semiconductor structure directly or by further treating, such as processing, as desired. When the semiconductor structure is used for a semiconductor device, the semiconductor structure of the present invention may be directly used for the semiconductor device or may be used by further forming another layer (e.g., insulating layer, semi-insulating layer, semiconductor layer, buffer layer, intermediate layer, etc.) or the like.

The semiconductor structure of the present invention is useful for a semiconductor device and is particularly useful for a power device. Semiconductor devices may be classified into lateral elements (lateral devices) having electrodes formed on one side of the semiconductor layer and vertical elements (vertical devices) having electrodes respectively on both sides of front and rear of the semiconductor layer. In the present invention, the semiconductor structure may be preferably used for a lateral device and a vertical device, and among all, the structure is preferably used for a vertical device. Examples of the semiconductor device include a Schottky barrier diode (SBD), a metal semiconductor field effect transistor (MESFET), a high electron mobility transistor (HEMT), a metal oxide semiconductor field effect transistor (MOSFET), a static induction transistor (SIT), a junction field effect transistor (JFET), an insulated gate bipolar transistor (IGBT), a light emitting diode, or the like. In the present invention, the semiconductor device is preferably an SBD, a MOSFET, an SIT, a JFET, or an IGBT and more preferably an SBD, a MOSFET, or an SIT. In the present invention, the semiconductor device may exclude a p type semiconductor layer.

The following descriptions are given to preferred examples of a crystalline semiconductor film with the semiconductor structure applied to an n type semiconductor layer (n+ type semiconductor, n− type semiconductor, etc.) with reference to the drawings while the present invention is not limited to these examples. As long as the objects of the present invention are not impaired, the semiconductor devices listed below may contain still another layer (e.g., insulating layer, semi-insulating layer, conductor layer, semiconductor layer, buffer layer, intermediate layer, etc.) and also a buffer layer may be omitted appropriately.

(SBD)

FIG. 1 illustrates an example of a Schottky barrier diode (SBD) according to the present invention. The SBD in FIG. 1 is provided with an n− type semiconductor layer 101a, an n+ type semiconductor layer 101b, a Schottky electrode 105a, and an ohmic electrode 105b.

Materials for the Schottky electrode and the ohmic electrode may be known electrode materials. Examples of such an electrode material include metal, such as Al, Mo, Co, Zr, Sn, Nb, Fe, Cr, Ta, Ti, Au, Pt, V, Mn, Ni, Cu, Hf, W, Ir, Zn, In, Pd, Nd, and Ag, and alloys thereof, metal oxide conductive films, such as tin oxide, zinc oxide, indium oxide, indium tin oxide (ITO), and indium zinc oxide (IZO), organic conductive compounds, such as polyaniline, polythiophene, and polypyrrole, and mixtures thereof, or the like.

The Schottky electrode and the ohmic electrode may be formed by known means, such as vacuum deposition and sputtering, for example. More specifically, the Schottky electrode may be formed by, for example, laminating a layer of Mo and a layer of Al and patterning the layer of Mo and the layer of Al using a photolithography technique.

When reverse bias is applied to the SBD in FIG. 1, a depletion layer, not shown, expands in the n type semiconductor layer 101a to make a high voltage SBD. When forward bias is applied, electrons flow from the ohmic electrode 105b to the Schottky electrode 105a. The SBD thus using the semiconductor structure is excellent for high voltage and high current applications, achieves high switching speed, and excellent in withstand voltage and reliability.

Figure 2:
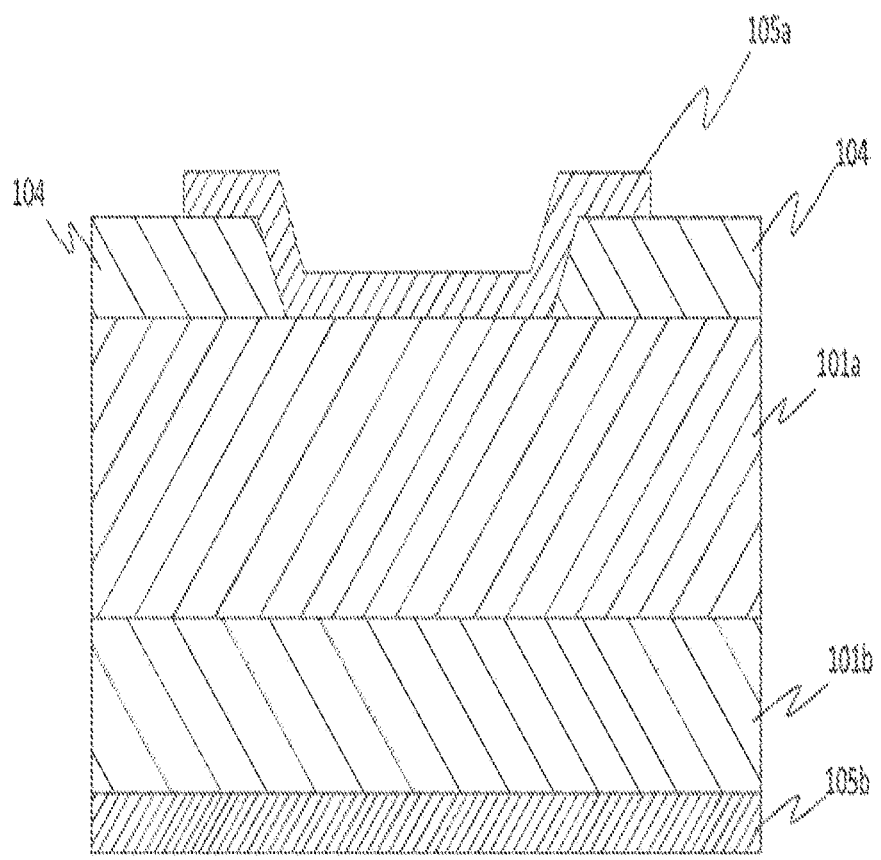
FIG. 2 is a diagram schematically illustrating another preferred example of a Schottky barrier diode (SBD) of the present invention.

FIG. 2 illustrates another example of a Schottky barrier diode (SBD) according to the present invention. In addition to the configuration of the SBD in FIG. 1, the SBD in FIG. 2 is further provided with an insulating layer 104. More specifically, this SBD is provided with an n− type semiconductor layer 101a, an n+ type semiconductor layer 101b, a Schottky electrode 105a, an ohmic electrode 105b, and an insulating layer 104.

Examples of a material for the insulating layer 104 include GaO, AlGaO, InAlGaO, AlInZnGaO$_4$, AN, Hf$_2$O$_3$, SiN, SiON, Al$_2$O$_3$, MgO, GdO, SiO$_2$, Si$_3$N$_4$, or the like. In the present invention, the material preferably has a corundum structure. Use of the corundum structured insulator for the insulating layer enables good development of the functions of semiconductor properties at the interface. The insulating layer 104 is provided between the n− type semiconductor layer 101a and the Schottky electrode 105a. The insulating layer may be formed by known means, such as sputtering, vacuum deposition, and CVD, for example.

Formation, materials, or the like for the Schottky electrode and the ohmic electrode are same as those in the case of the SBD in FIG. 1 above. The electrodes may be formed by known means, such as sputtering, vacuum deposition, and CVD, for example, and made from metal, such as Al, Mo, Co, Zr, Sn, Nb, Fe, Cr, Ta, Ti, Au, Pt, V, Mn, Ni, Cu, Hf, W, Ir, Zn, In, Pd, Nd, and Ag, and alloys thereof, metal oxide conductive films, such as tin oxide, zinc oxide, indium oxide, indium tin oxide (ITO), and indium zinc oxide (IZO), organic conductive compounds, such as polyaniline, polythiophene, and polypyrrole, and mixtures thereof, or the like.

The SBD in FIG. 2 has, compared with the SBD in FIG. 1, even more excellent in insulating properties and higher current controllability.

Figure 3:
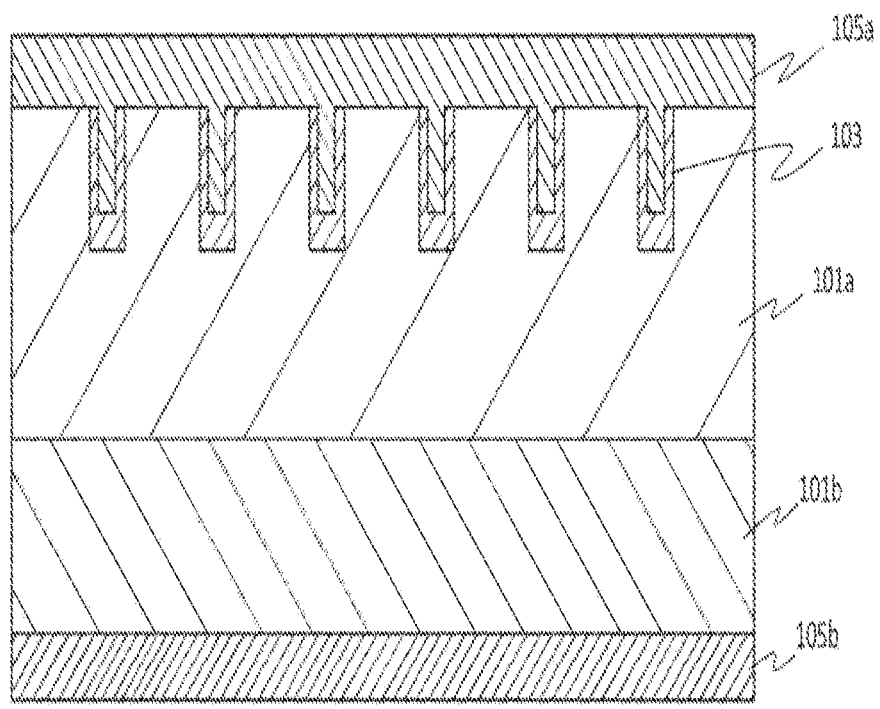
FIG. 3 is a diagram schematically illustrating still another preferred example of a Schottky barrier diode (SBD) of the present invention.

FIG. 3 illustrates still another SBD example of a Schottky barrier diode (SBD) according to the present invention. The SBD in FIG. 3 is greatly different from the configuration of the SBDs in FIGS. 1 and 2 in the points of having a trench structure and including a semi-insulating layer 103. The SBD in FIG. 3 is provided with an n− type semiconductor layer 101a, an n+ type semiconductor layer 101b, a Schottky electrode 105a, an ohmic electrode 105b, and the semi-insulating layer 103. This SBD is capable of great reduction in leakage current and great reduction in on resistance while maintaining the withstand voltage.

The semi-insulating layer 103 may be configured with a semi-insulator. Examples of the semi-insulator include those containing a semi-insulator dopant, such as magnesium (Mg), ruthenium (Ru), iron (Fe), beryllium (Be), cesium (Cs), strontium, and barium, those undoped, or the like.

(MESFET)

Figure 4:
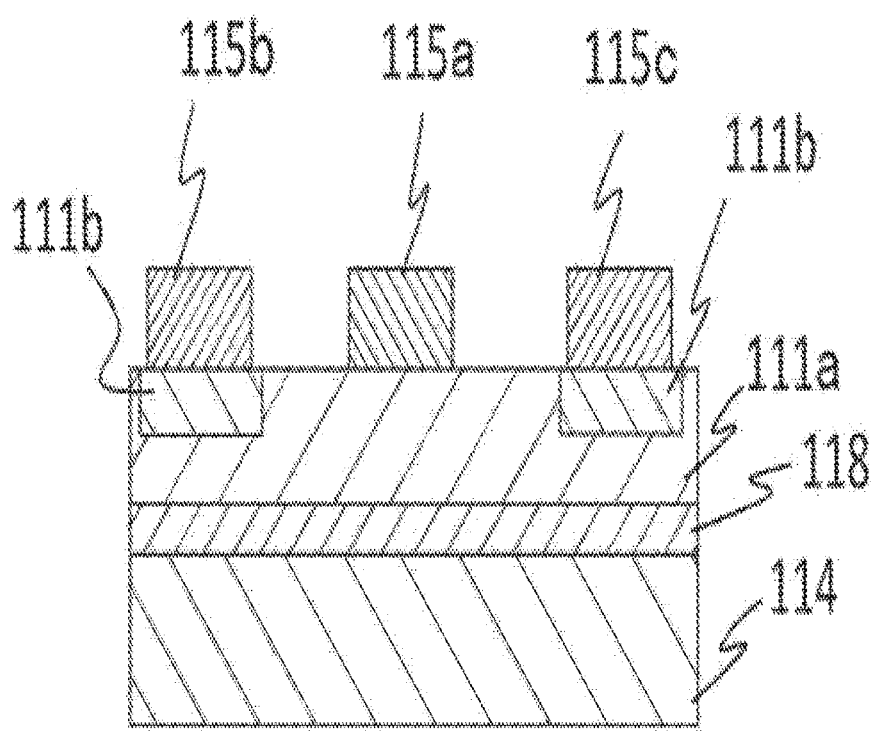
FIG. 4 is a diagram schematically illustrating a preferred example of a metal semiconductor field effect transistor (MESFET) of the present invention.

FIG. 4 illustrates an example of a metal semiconductor field effect transistor (MESFET) according to the present invention. The MESFET in FIG. 4 is provided with an n− type semiconductor layer 111a, an n+ type semiconductor layer 111b, a buffer layer 118, a semi-insulating layer 114, a gate electrode 115a, a source electrode 115b, and a drain electrode 115c.

Materials for the gate electrode, the drain electrode, and the source electrode may be known electrode materials. Examples of the electrode materials include metal, such as Al, Mo, Co, Zr, Sn, Nb, Fe, Cr, Ta, Ti, Au, Pt, V, Mn, Ni, Cu, Hf, W, Ir, Zn, In, Pd, Nd, and Ag, and alloys thereof, metal oxide conductive films, such as tin oxide, zinc oxide, indium oxide, indium tin oxide (ITO), and indium zinc oxide (IZO), organic conductive compounds, such as polyaniline, polythiophene, and polypyrrole, and mixtures thereof, or the like. The gate electrode, the drain electrode, and the source electrode may be formed by known means, such as vacuum deposition and sputtering, for example.

The semi-insulating layer 114 may be configured with a semi-insulator. Examples of the semi-insulator include those containing a semi-insulator dopant, such as magnesium (Mg), ruthenium (Ru), iron (Fe), beryllium (Be), cesium (Cs), strontium, and barium, those undoped, or the like.

In the MESFET in FIG. 4, a good depletion layer is formed under the gate electrode, and the current flowing from the drain electrode to the source electrode is thus efficiently controlled.

(HEMT)

Figure 5:
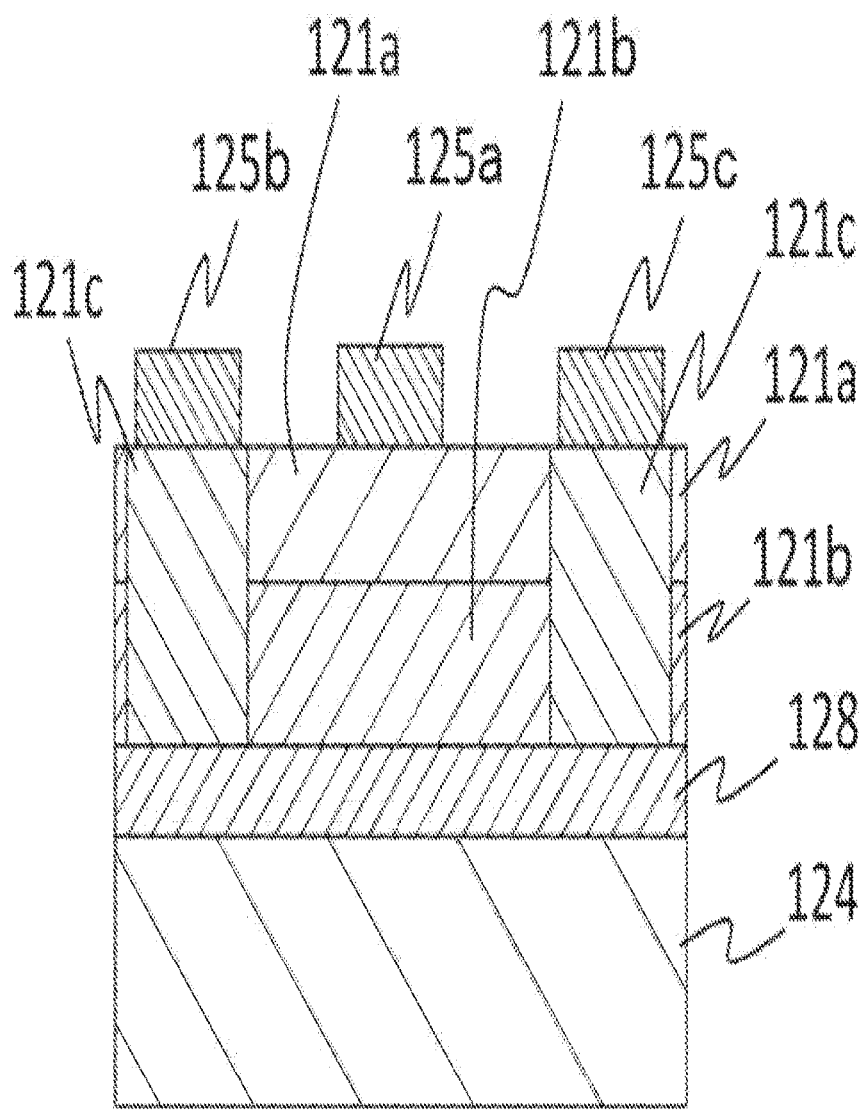
FIG. 5 is a diagram schematically illustrating a preferred example of a high electron mobility transistor (HEMT) of the present invention.

FIG. 5 illustrates an example of a high electron mobility transistor (HEMT) according to the present invention. The HEMT in FIG. 5 is provided with an n type semiconductor layer 121a with a wide band gap, an n type semiconductor layer 121b with a narrow band gap, an n+ type semiconductor layer 121c, a semi-insulating layer 124, a buffer layer 128, a gate electrode 125a, a source electrode 125b, and a drain electrode 125c.

Materials for the gate electrode, the drain electrode, and the source electrode may be respective known electrode materials. Examples of the electrode materials include metal, such as Al, Mo, Co, Zr, Sn, Nb, Fe, Cr, Ta, Ti, Au, Pt, V, Mn, Ni, Cu, Hf, W, Ir, Zn, In, Pd, Nd, and Ag, and alloys thereof, metal oxide conductive films, such as tin oxide, zinc oxide, indium oxide, indium tin oxide (ITO), and indium zinc oxide (IZO), organic conductive compounds, such as polyaniline, polythiophene, and polypyrrole, and mixtures thereof, or the like. The gate electrode, the drain electrode, and the source electrode may be formed by known means, such as vacuum deposition and sputtering, for example.

The n type semiconductor layers under the gate electrode are configured at least with the layer 121a with a wide band gap and the layer 121b with a narrow band gap and the semi-insulating layer 124 is configured with a semi-insulator. Examples of the semi-insulator include those containing a semi-insulator dopant, such as ruthenium (Ru) and iron (Fe), those undoped, or the like.

In the HEMT in FIG. 5, a good depletion layer is formed under the gate electrode, and the current flowing from the drain electrode to the source electrode is thus efficiently controlled. Further, in the present invention, formation of a recess structure enables normally-off characteristics.

(MOSFET)

Figure 6:
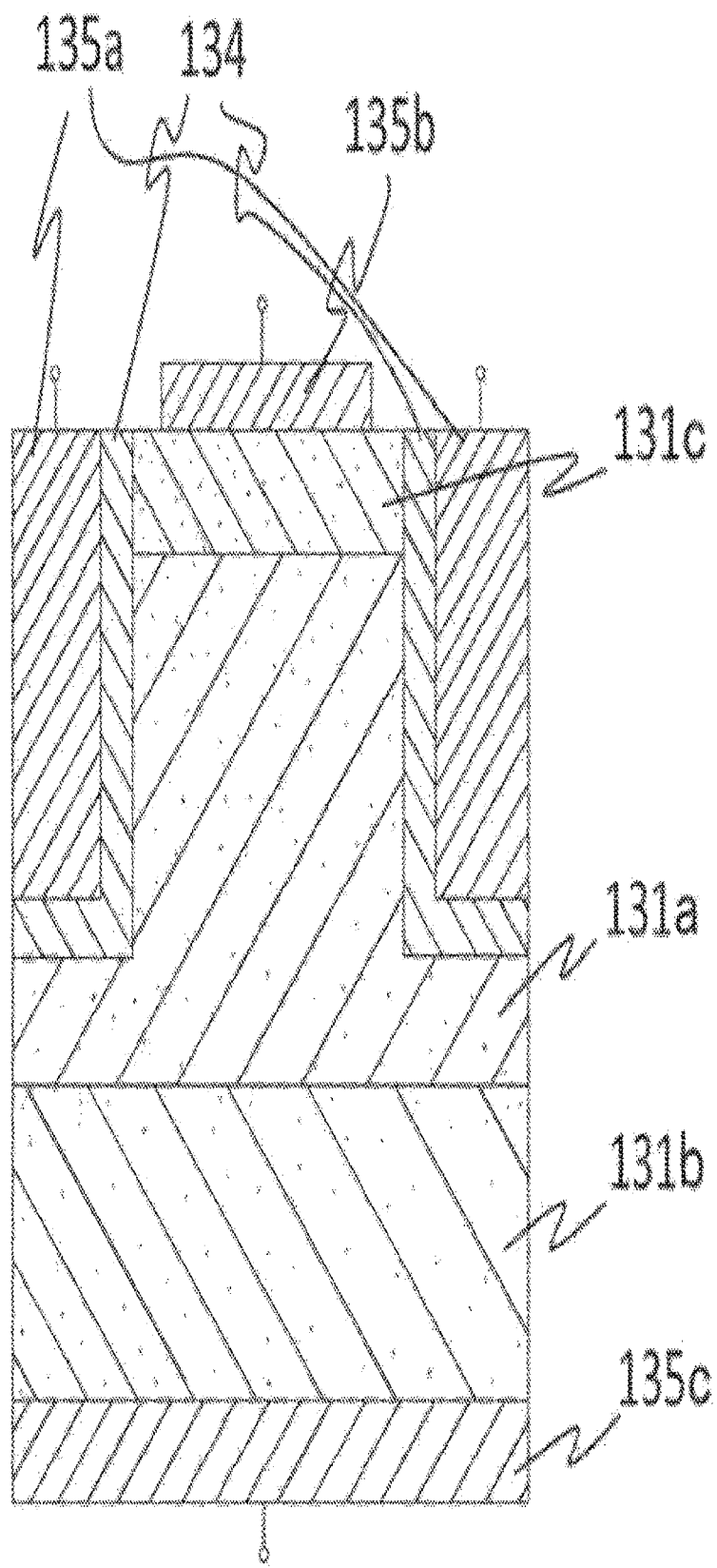
FIG. 6 is a diagram schematically illustrating a preferred example of a metal oxide semiconductor field effect transistor (MOSFET) of the present invention.

FIG. 6 illustrates an example of a MOSFET as the semiconductor device of the present invention. The MOS- FET in FIG. 6 is a trench MOSFET and provided with an n− type semiconductor layer 131a, n+ type semiconductor layers 131b and 131c, a gate insulating film 134, a gate electrode 135a, a source electrode 135b, and a drain electrode 135c.

On the drain electrode 135c, the n+ type semiconductor layer 131b having a thickness, for example, from 100 nm to 100 μm is formed. On the n+ type semiconductor layer 131b, the n− type semiconductor layer 131a having a thickness, for example, from 100 nm to 100 μm is formed. Further, on the n− type semiconductor layer 131a, the n+ type semiconductor layer 131c is formed. On the n+ type semiconductor layer 131c, the source electrode 135b is formed.

In the n− type semiconductor layer 131a and the n+ type semiconductor layer 131c, a plurality of trench grooves are formed that has a depth reaching at some point of the n− type semiconductor layer 131a through the n+ semiconductor layer 131c. The gate electrode 135a is formed embedded in the trench grooves via the gate insulating film 134 having a thickness, for example, from 10 nm to 1 μm.

In an on state of the MOSFET in FIG. 6, when a voltage is applied between the source electrode 135b and the drain electrode 135c to give a voltage, positive to the source electrode 135b, to the gate electrode 135a, channel layers are formed on the sides of the n− type semiconductor layer 131a and the electrons are injected into the n− type semiconductor layer 131a to be turned on. In an off state, the voltage of the gate electrode is made 0 V, thereby no longer producing the channel layers. The n− type semiconductor layer 131a is then filled with a depletion layer to be turned off.

Figure 7A:
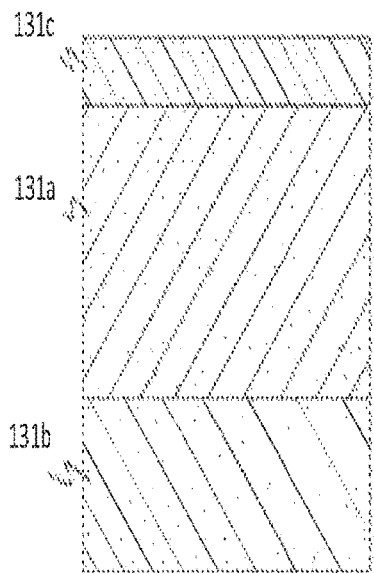
FIGS. 7A to 7C show schematic views illustrating part of a procedure of manufacturing the metal oxide semiconductor field effect transistor (MOSFET) in FIG. 6.
Figure 7B:
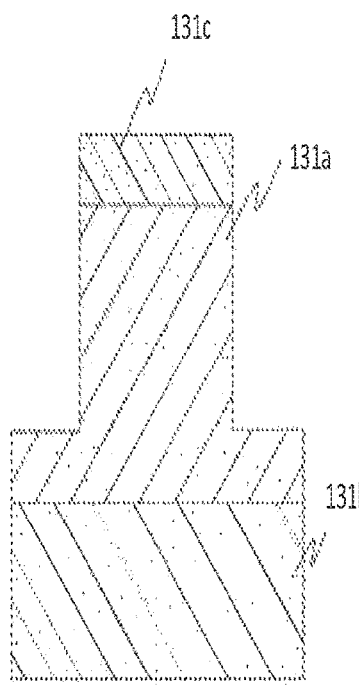
Figure 7C:
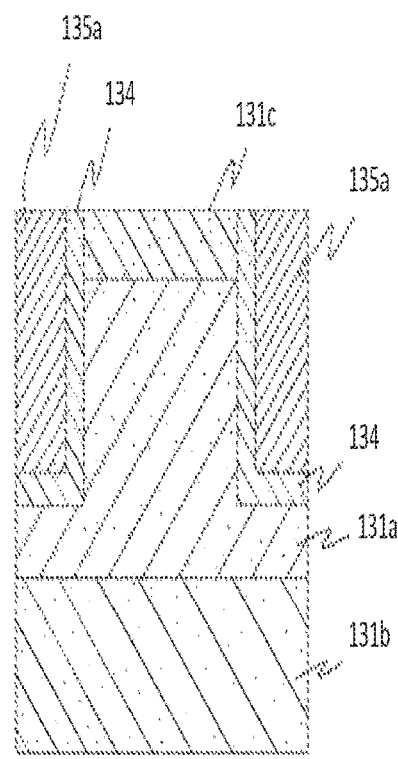

FIGS. 7A to 7C illustrates part of a procedure of manufacturing the MOSFET in FIG. 6. For example, using a semiconductor structure as illustrated in FIG. 7A, an etching mask is provided in a predetermined region of the n− type semiconductor layer 131a and the n+ type semiconductor layer 131c. Using the etching mask as a mask, anisotropic etching is further performed by reactive ion etching or the like to form, as illustrated in FIG. 7B, trench grooves with a depth from the surface of the n+ type semiconductor layer 131c to some point of the n− type semiconductor layer 131a. Then, as illustrated in FIG. 7C, the gate insulating film 134 with a thickness, for example, from 50 nm to 1 μm is formed on the sides and the bottom of the trench grooves using known means, such as thermal oxidation, vacuum deposition, sputtering, and CVD. Then, using CVD, vacuum deposition, sputtering, or the like, a gate electrode material 135a, such as polysilicon, for example, is formed on the trench grooves with a thickness equal to or less than that of the n− type semiconductor layer.

Then, using known means, such as vacuum deposition, sputtering, and CVD, the source electrode 135b is formed on the n+ type semiconductor layer 131c and the drain electrode 135c is formed on the n+ type semiconductor layer 131b to manufacture a power MOSFET. Electrode materials for the source electrode and the drain electrode may be respective known electrode materials, and examples of the electrode materials include metal, such as Al, Mo, Co, Zr, Sn, Nb, Fe, Cr, Ta, Ti, Au, Pt, V, Mn, Ni, Cu, Hf, W, Ir, Zn, In, Pd, Nd, and Ag, and alloys thereof, metal oxide conductive films, such as tin oxide, zinc oxide, indium oxide, indium tin oxide (ITO), and indium zinc oxide (IZO), organic conductive compounds, such as polyaniline, polythiophene, and polypyrrole, and mixtures thereof, or the like.

Figure 8:
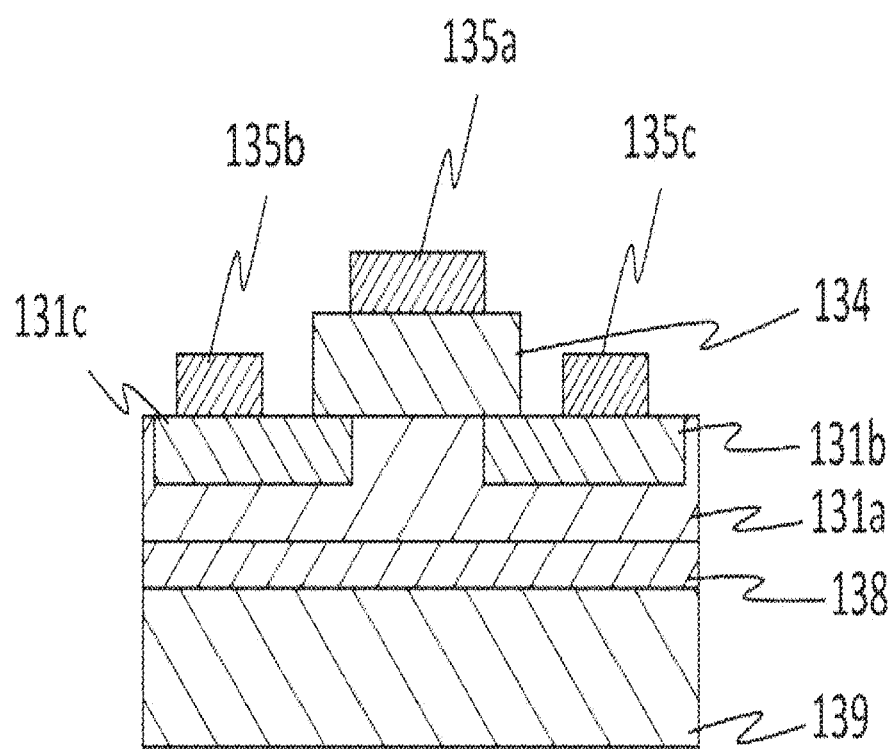
FIG. 8 is a diagram schematically illustrating an example of a metal oxide semiconductor field effect transistor (MOSFET) of the present invention.

The MOSFET thus obtained is even more excellent in withstand voltage compared with conventional trench MOSFETs. Although FIG. 6 illustrates the example of the trench vertical MOSFET, the present invention is not limited to this and is applicable to various forms of MOSFET. For example, the trench grooves in FIG. 6 may be formed deeper down to the bottom of the n− type semiconductor layer 131a to reduce series resistance. FIG. 8 illustrates an example of a lateral MOSFET. The MOSFET in FIG. 8 is provided with an n− type semiconductor layer 131a, a first n+ type semiconductor layer 131b, a second n+ type semiconductor layer 131c, a gate insulating film 134, a gate electrode 135a, a source electrode 135b, a drain electrode 135c, a buffer layer 138, and a semi-insulating layer 139. As illustrated in FIG. 8, the n+ type semiconductor layers are embedded in the n− type semiconductor layer to enable better flow of a current compared with that in other lateral MOSFETs.

(SIT)

Figure 9:
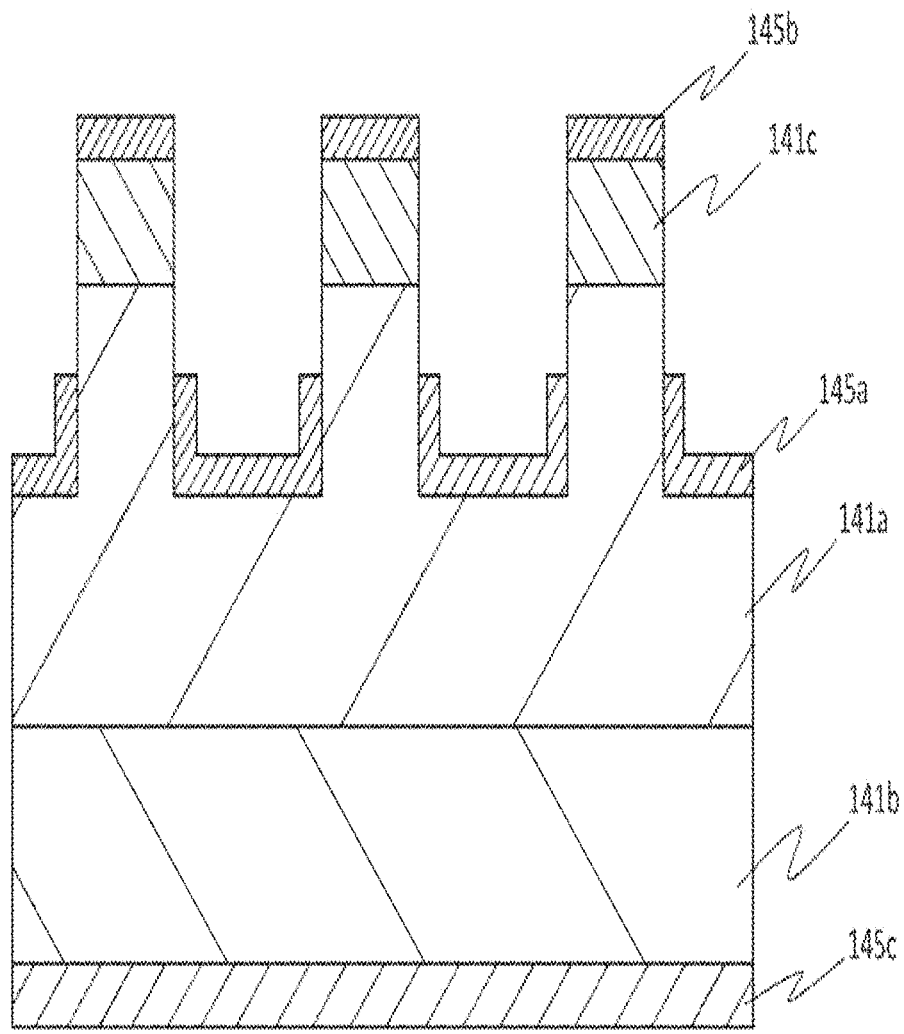
FIG. 9 is a diagram schematically illustrating a preferred example of a static induction transistor (SIT) of the present invention.

FIG. 9 illustrates an example of an SIT as the semiconductor device of the present invention. The SIT in FIG. 9 is provided with an n− type semiconductor layer 141a, n+ type semiconductor layers 141b and 141c, gate electrodes 145a, source electrodes 145b, and a drain electrode 145c.

On the drain electrode 145c, the n+ type semiconductor layer 141b having a thickness, for example, from 100 nm to 100 μm is formed. On the n+ type semiconductor layer 141b, the n− type semiconductor layer 141a having a thickness, for example, from 100 nm to 100 μm is formed. Further, on the n− type semiconductor layer 141a, the n+ type semiconductor layer 141c is formed. On the n+ type semiconductor layer 141c, the source electrodes 145b are formed.

In the n− type semiconductor layer 141a, a plurality of trench grooves are formed that has a depth reaching at some point of the n− semiconductor layer 141a through the n+ semiconductor layer 141c. On the n− type semiconductor layer in the trench grooves, gate electrodes 145a are formed.

In an on state of the SIT in FIG. 9, when a voltage is applied between the source electrodes 145b and the drain electrode 145c to give a voltage, positive to the source electrodes 145b, to the gate electrodes 145a, a channel layer is formed in the n− type semiconductor layer 141a and the electrons are injected into the n− type semiconductor layer 141a to be turned on. In an off state, the voltage of the gate electrode is made 0 V, thereby no longer producing the channel layers. The n− type semiconductor layer 141a is then filled with a depletion layer to be turned off.

The SIT illustrated in FIG. 9 may be manufactured by known means. For example, using the semiconductor structure illustrated in FIG. 7A, in the same manner as the procedure of manufacturing an MOSFET in FIGS. 7A to 7C above, an etching mask is provided in a predetermined region of the n− type semiconductor layer 141a and the n+ type semiconductor layer 141c. Using the etching mask as a mask, anisotropic etching is performed by, for example, reactive ion etching or the like to form trench grooves with a depth from the surface of the n+ type semiconductor layer 141c to some point of the n− type semiconductor layer 141a. Then, by CVD, vacuum deposition, sputtering, or the like, a gate electrode material, such as polysilicon, for example, is formed on the trench grooves with a thickness equal to or less than that of the n− type semiconductor layer. Then, using known means, such as CVD, vacuum deposition, and sputtering, the source electrodes 145b are formed on the n+ type semiconductor layer 141c and the drain electrode 145c is formed on the n+ type semiconductor layer 141b to manufacture the SIT illustrated in FIG. 9.

Electrode materials for the source electrodes and the drain electrode may be respective known electrode materials, and examples of the electrode materials include metal, such as Al, Mo, Co, Zr, Sn, Nb, Fe, Cr, Ta, Ti, Au, Pt, V, Mn, Ni, Cu, Hf, W, Ir, Zn, In, Pd, Nd, and Ag, and alloys thereof, metal oxide conductive films, such as tin oxide, zinc oxide, indium oxide, indium tin oxide (ITO), and indium zinc oxide (IZO), organic conductive compounds, such as polyaniline, polythiophene, and polypyrrole, and mixtures thereof, or the like.

Although a p type semiconductor is not used in the above example, the present invention is not limited to such an example and a p type semiconductor may be used. FIGS. 10 to 16 illustrate examples using a p type semiconductor. These semiconductor devices may be manufactured in the manner same as that in the above example. The p type semiconductor may be of the material same as that for the n type semiconductor but containing a p type dopant, or may be different from that.

Figure 10:
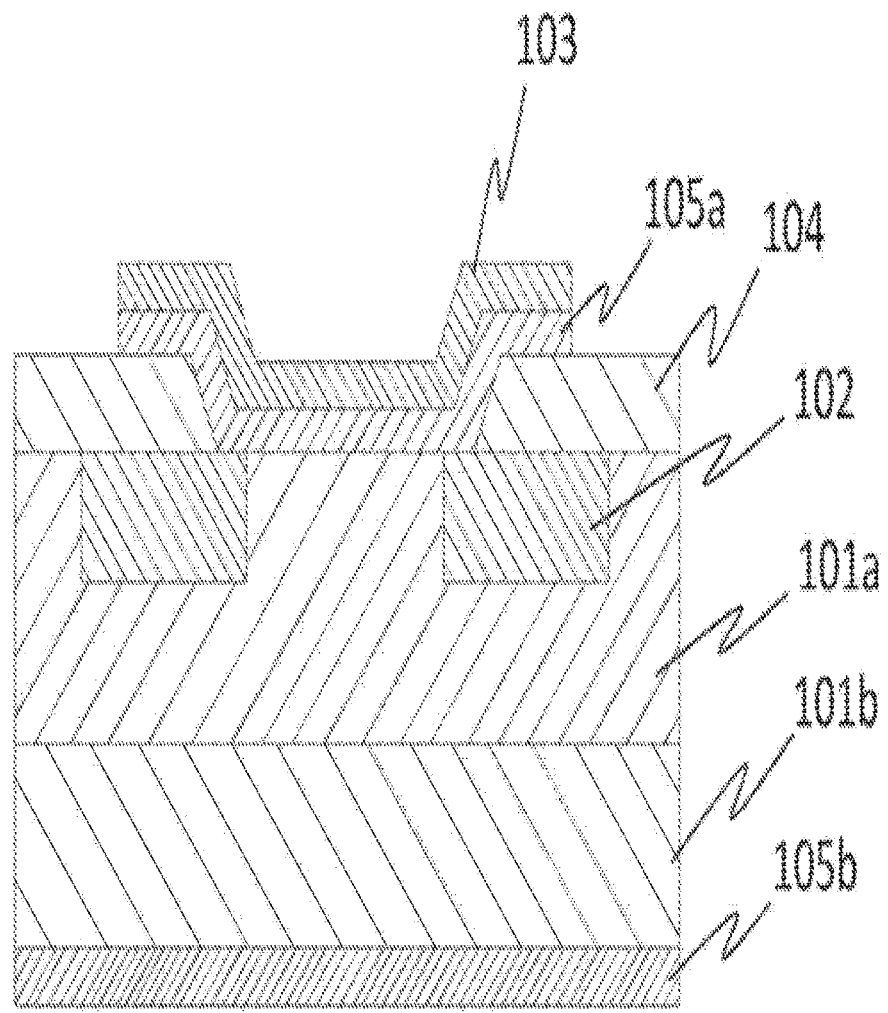
FIG. 10 is a diagram schematically illustrating another preferred example of a Schottky barrier diode (SBD) of the present invention.

FIG. 10 illustrates a preferred example of a Schottky barrier diode (SBD) provided with an n− type semiconductor layer 101a, an n+ type semiconductor layer 101b, a p type semiconductor layer 102, an insulating layer 104, a Schottky electrode 105a, and an ohmic electrode 105b.

Figure 11:
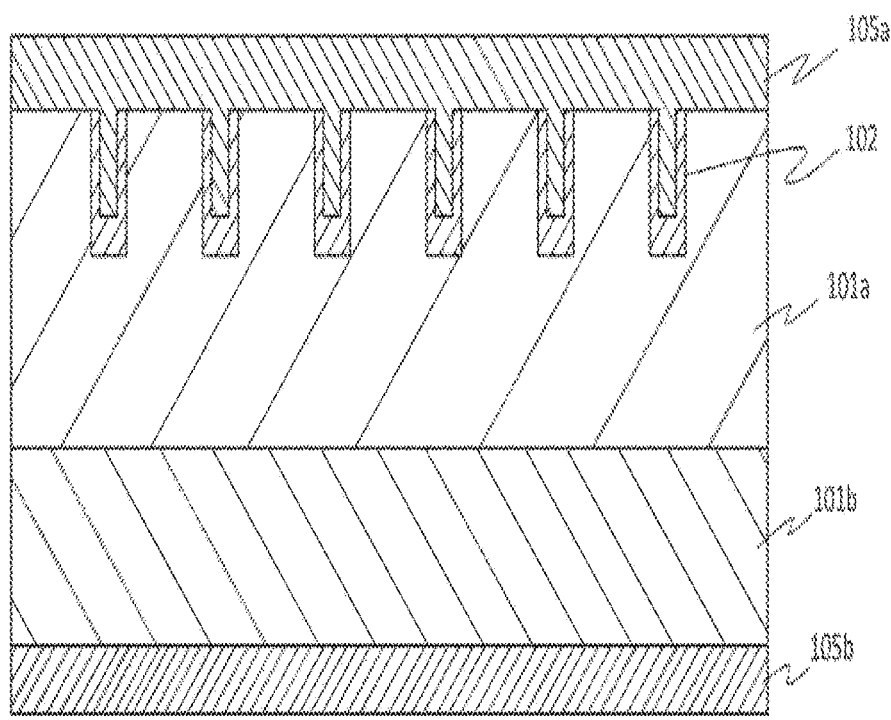
FIG. 11 is a diagram schematically illustrating another preferred example of a Schottky barrier diode (SBD) of the present invention.

FIG. 11 illustrates a preferred example of a trench Schottky barrier diode (SBD) provided with an n− type semiconductor layer 101a, an n+ type semiconductor layer 101b, a p type semiconductor layer 102, a Schottky electrode 105a, and an ohmic electrode 105b. Such a trench SBD enables great reduction in the leakage current and great reduction in the on resistance while maintaining withstand voltage.

Figure 12:
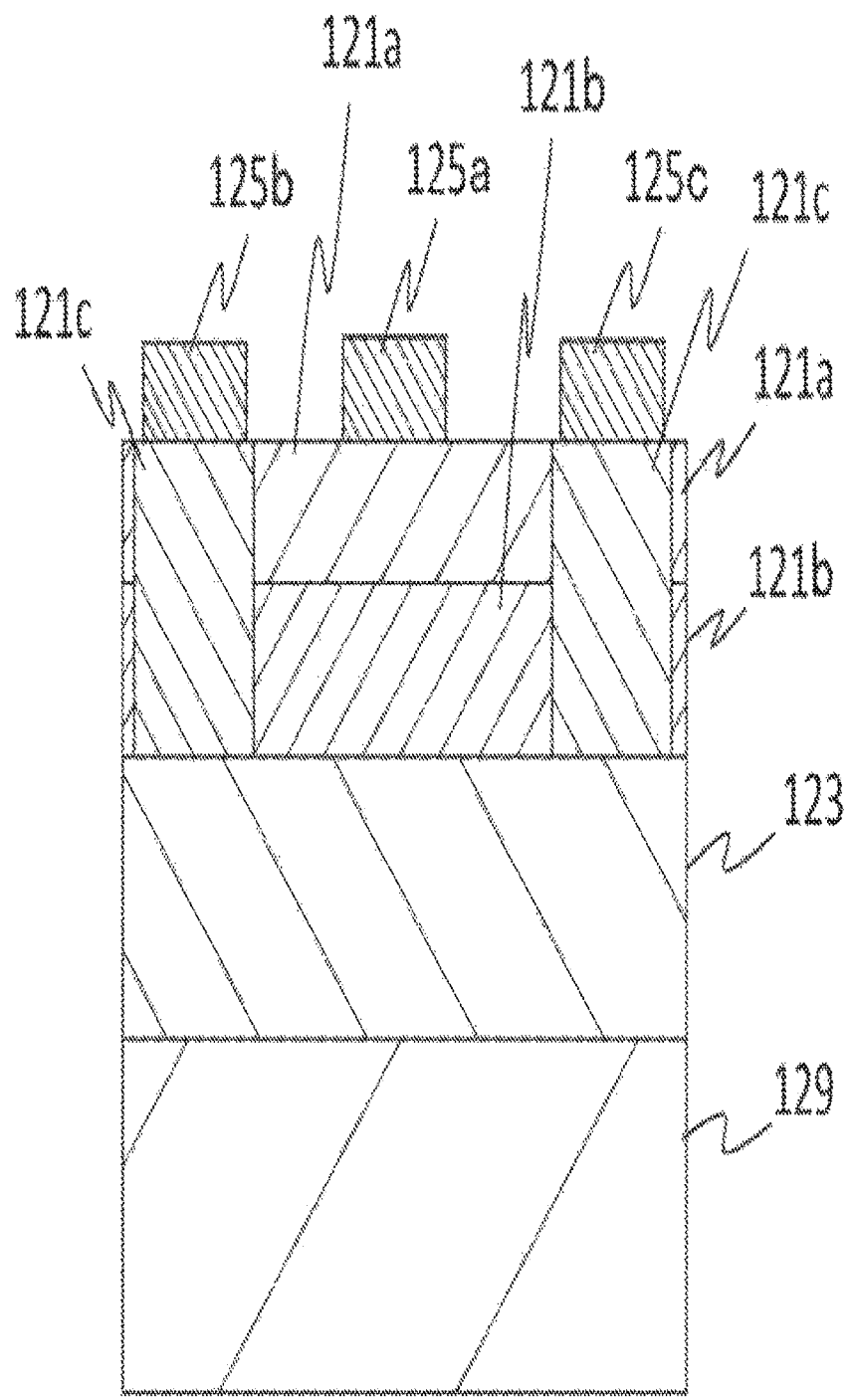
FIG. 12 is a diagram schematically illustrating another preferred example of a high electron mobility transistor (HEMT) of the present invention.

FIG. 12 illustrates a preferred example of a high electron mobility transistor (HEMT) provided with an n type semiconductor layer 121a with a wide band gap, an n type semiconductor layer 121b with a narrow band gap, an n+ type semiconductor layer 121c, a p type semiconductor layer 123, a gate electrode 125a, a source electrode 125b, a drain electrode 125c, and a substrate 129.

Figure 13:
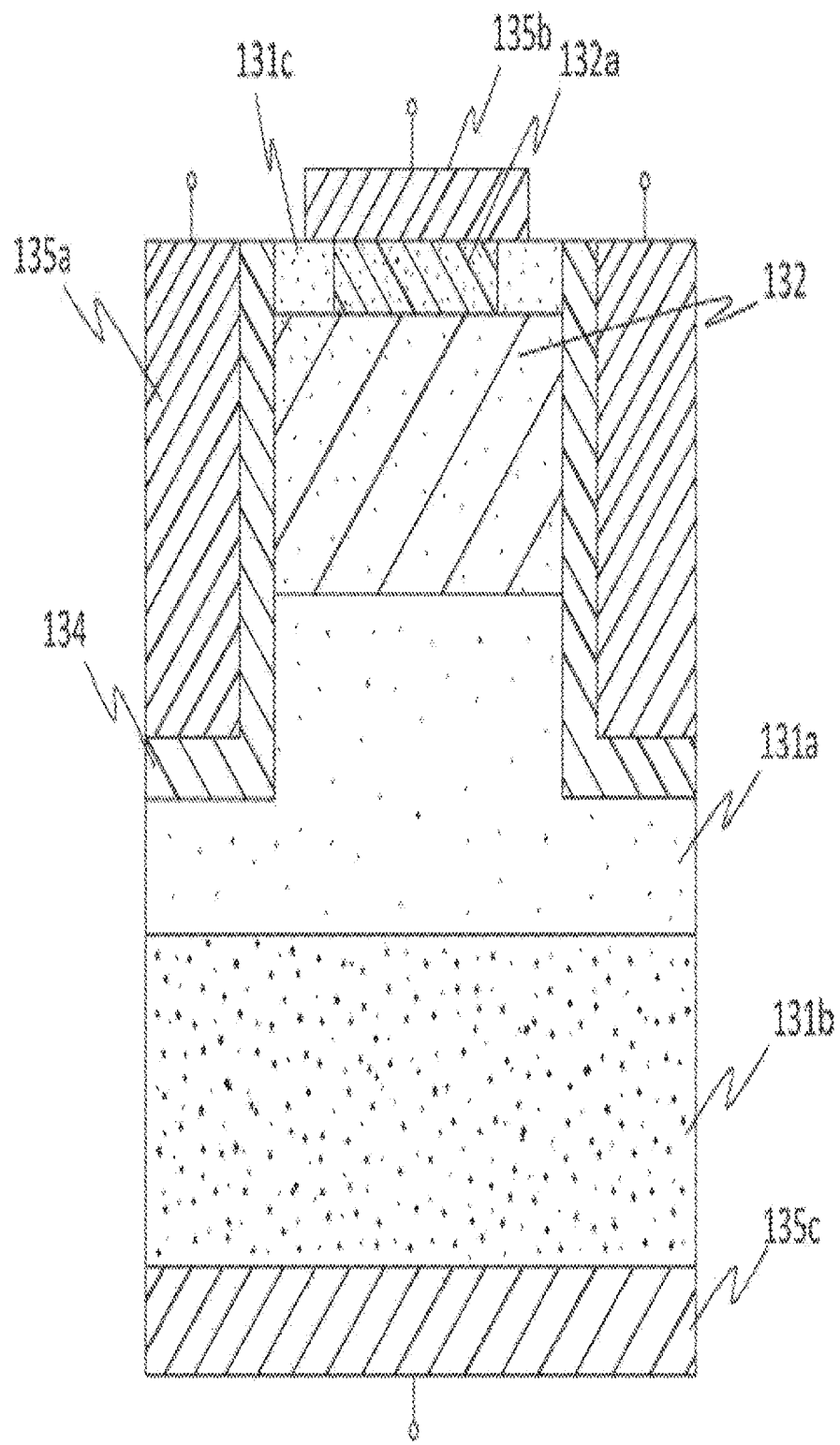
FIG. 13 is a diagram schematically illustrating another preferred example of a metal oxide semiconductor field effect transistor (MOSFET) of the present invention.

FIG. 13 illustrates a preferred example of a metal oxide semiconductor field effect transistor (MOSFET) provided with an n− type semiconductor layer 131a, a first n+ type semiconductor layer 131b, a second n+ type semiconductor layer 131c, a p type semiconductor layer 132, a p+ type semiconductor layer 132a, a gate insulating film 134, a gate electrode 135a, a source electrode 135b, and a drain electrode 135c. The p+ type semiconductor layer 132a may be a p type semiconductor layer and may be same as the p type semiconductor layer 132.

Figure 14:
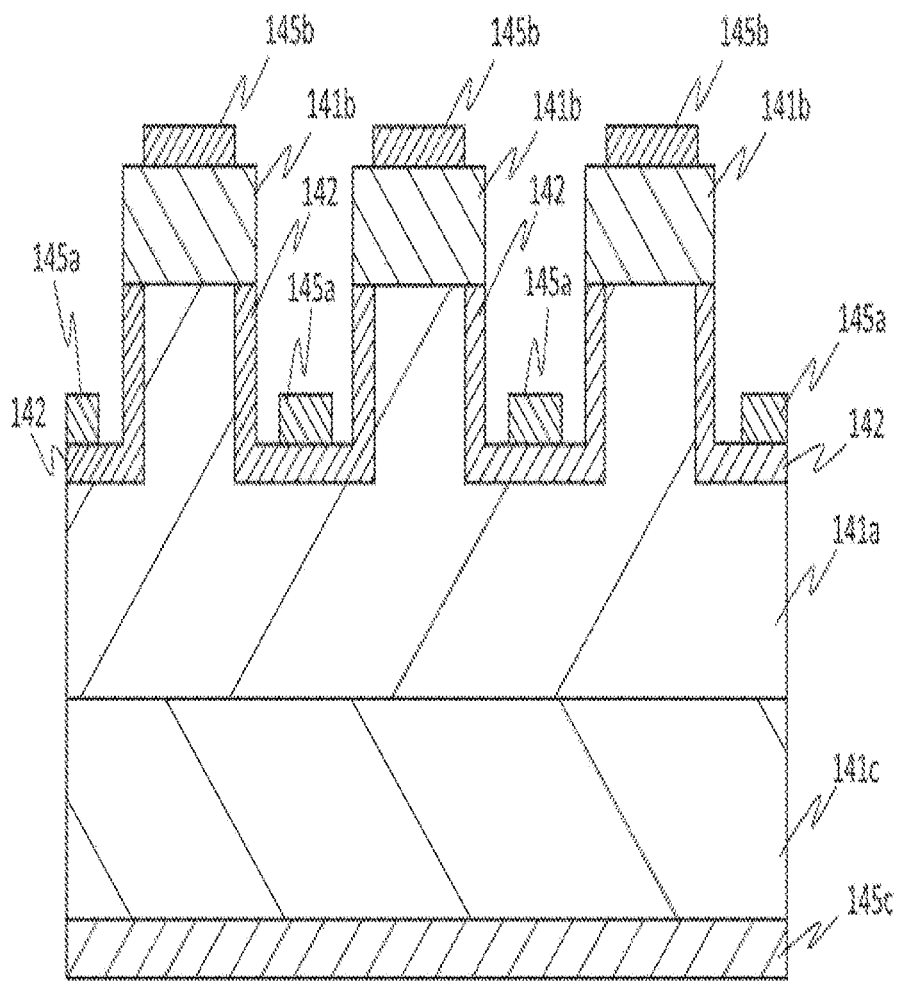
FIG. 14 is a diagram schematically illustrating a preferred example of a junction field effect transistor (JFET) of the present invention.

FIG. 14 illustrates a preferred example of a junction field effect transistor (JFET) provided with an n− type semiconductor layer 141a, a first n+ type semiconductor layer 141b, a second n+ type semiconductor layer 141c, a p type semiconductor layer 142, gate electrodes 145a, source electrodes 145b, and the drain electrode 145c.

Figure 15:
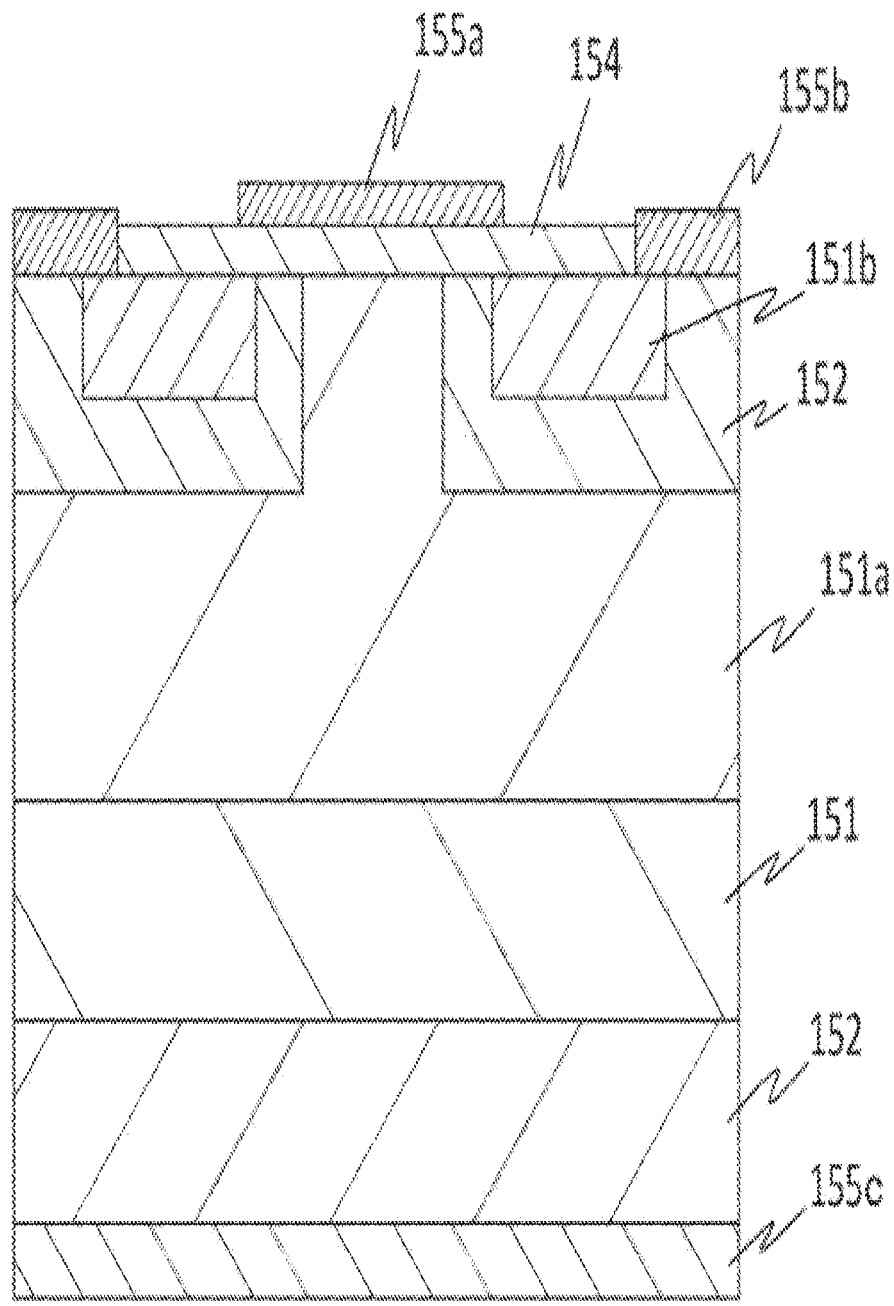
FIG. 15 is a diagram schematically illustrating a preferred example of an insulated gate bipolar transistor (IGBT) of the present invention.

FIG. 15 illustrates a preferred example of an insulated gate bipolar transistor (IGBT) provided with an n type semiconductor layer 151, an n− type semiconductor layer 151a, n+ type semiconductor layers 151b, a p type semiconductor layer 152, a gate insulating film 154, a gate electrode 155a, emitter electrodes 155b, and a collector electrode 155c.

(LED)

Figure 16:
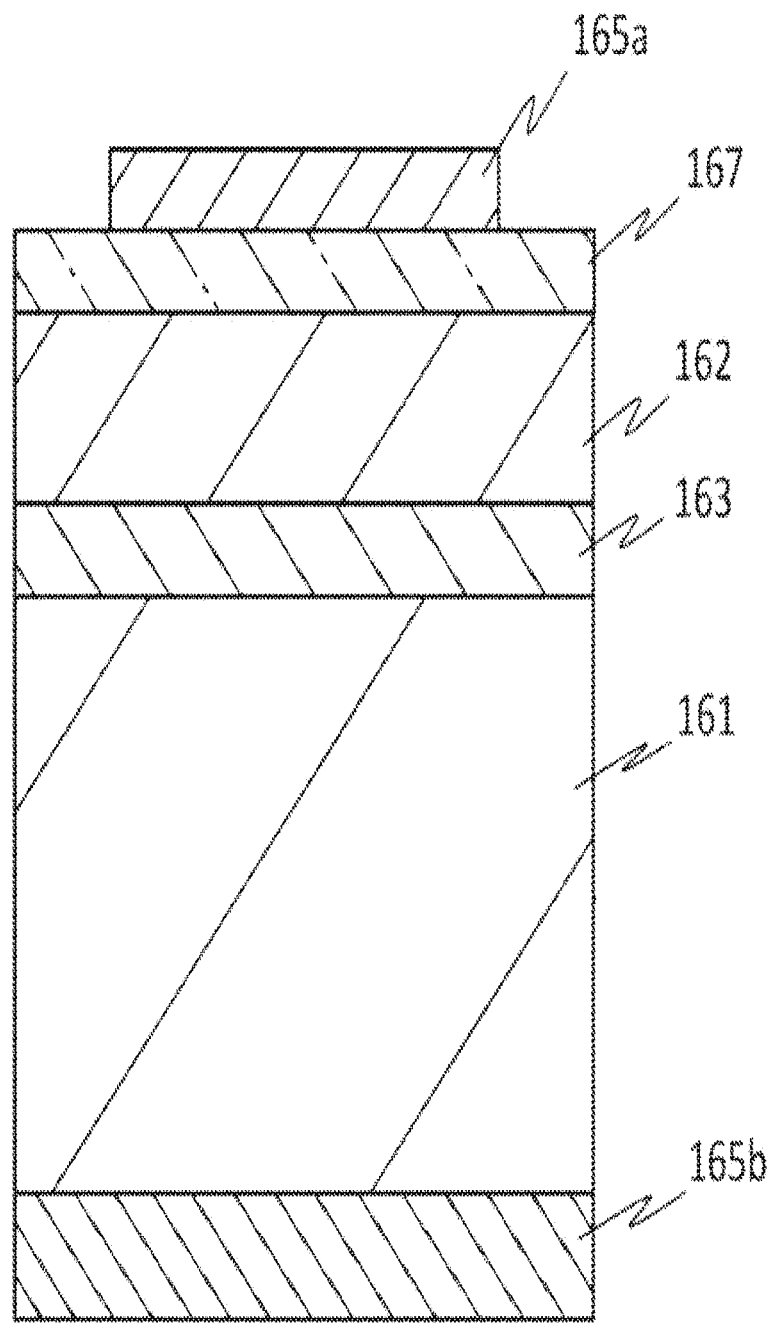
FIG. 16 is a diagram schematically illustrating a preferred example of a light emitting device (LED) of the present invention.

FIG. 16 illustrates an example of a light emitting diode (LED) as the semiconductor device of the present invention. The semiconductor light emitting device in FIG. 16 is provided with an n type semiconductor layer 161 on a second electrode 165b, and on the n type semiconductor layer 161, a light emitting layer 163 is laminated. Then, on the light emitting layer 163, a p type semiconductor layer 162 is laminated. On the p type semiconductor layer 162, a translucent electrode 167 is provided that transmits light produced by the light emitting layer 163. On the translucent electrode 167, a first electrode 165a is laminated. The semiconductor light emitting device in FIG. 16 may be covered with a protective layer except for the electrode portions.

Examples of the material for the translucent electrode include conductive materials of oxide containing indium (In) or titanium (Ti) or the like. More specific examples include $In_2O_3$, $ZnO$, $SnO_2$, $Ga_2O_3$, $TiO_2$, and $CeO_2$, mixed crystal of two or more of them, those doped by them, or the like. Such a material is provided by known means, such as sputtering, to form a translucent electrode. After forming the translucent electrode, thermal annealing may be applied to make the translucent electrode transparent.

According to the semiconductor light emitting device in FIG. 16, where the first electrode 165a is a cathode and the second electrode 165b is an anode, a flow of current via both of them to the p type semiconductor layer 162, the light emitting layer 163, and the n type semiconductor layer 161 causes the light emitting layer 163 to emit light.

Examples of the materials for the first electrode and the second electrode include metal, such as Al, Mo, Co, Zr, Sn, Nb, Fe, Cr, Ta, Ti, Au, Pt, V, Mn, Ni, Cu, Hf, W, Ir, Zn, In, Pd, Nd, and Ag, and alloys thereof, metal oxide conductive films, such as tin oxide, zinc oxide, indium oxide, indium tin oxide (ITO), and indium zinc oxide (IZO), organic conductive compounds, such as polyaniline, polythiophene, and polypyrrole, and mixtures thereof, or the like. A method of forming the electrodes is not particularly limited. The electrodes may be formed on the substrate in accordance with a method appropriately selected by considering suitability for the above material from printing process, wet process such as spraying and coating, physical process such as vacuum deposition, sputtering, and ion plating, chemical process such as CVD and plasma CVD, or the like.

Figure 17:
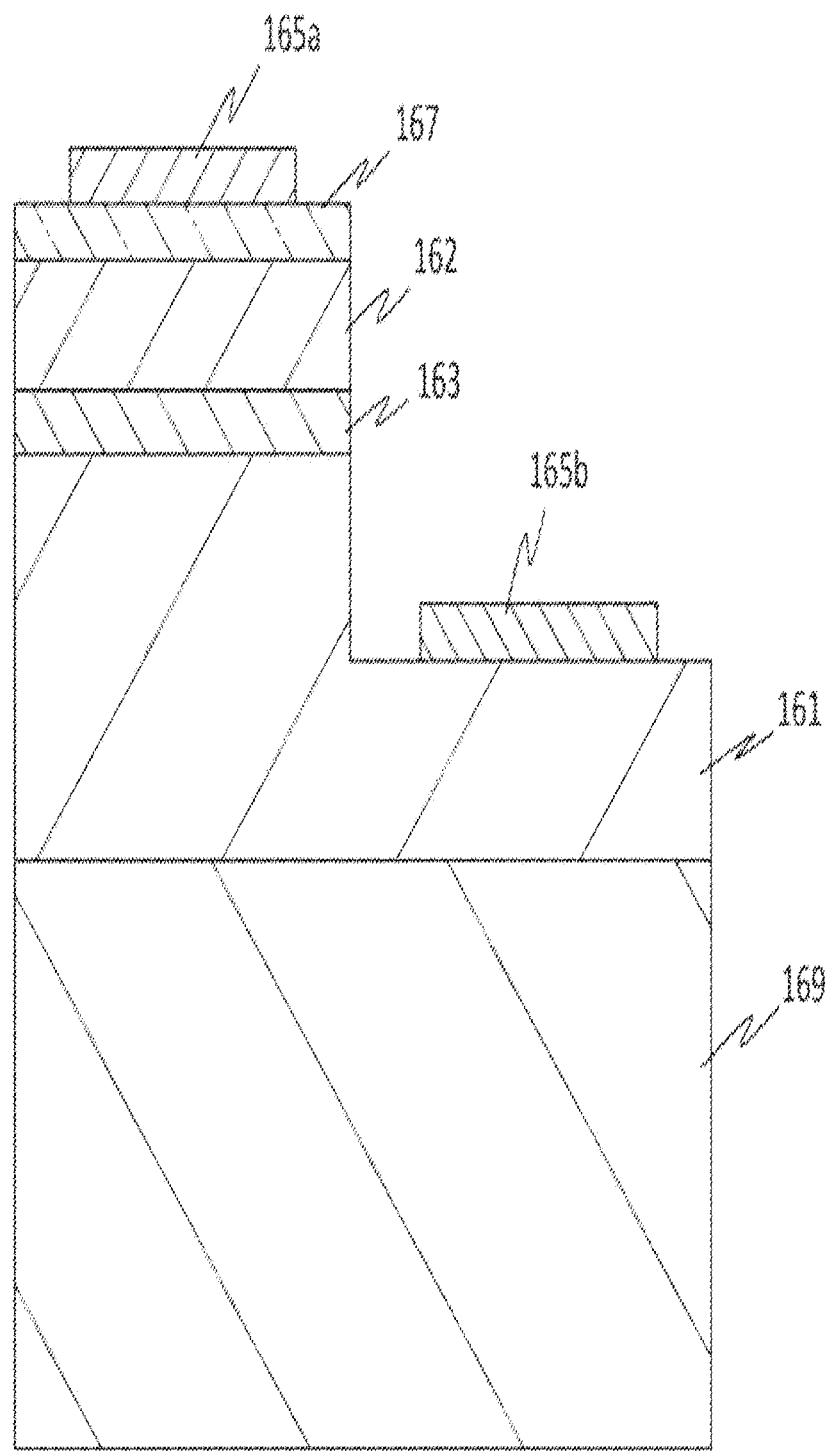
FIG. 17 is a diagram schematically illustrating another preferred example of a light emitting device (LED) of the present invention.

FIG. 17 illustrates another embodiment of a light emitting device. In the light emitting device in FIG. 17, an n type semiconductor layer 161 is laminated on a substrate 169. A p type semiconductor layer 162, a light emitting layer 163, and part of the n type semiconductor layer 161 are notched to expose the n type semiconductor layer 161. On part of the exposed surface of the semiconductor layer, the second electrode 165b is laminated.

EXAMPLE

Examples of the present invention are described below.

Example 1

1. Film Formation Apparatus

Figure 18:
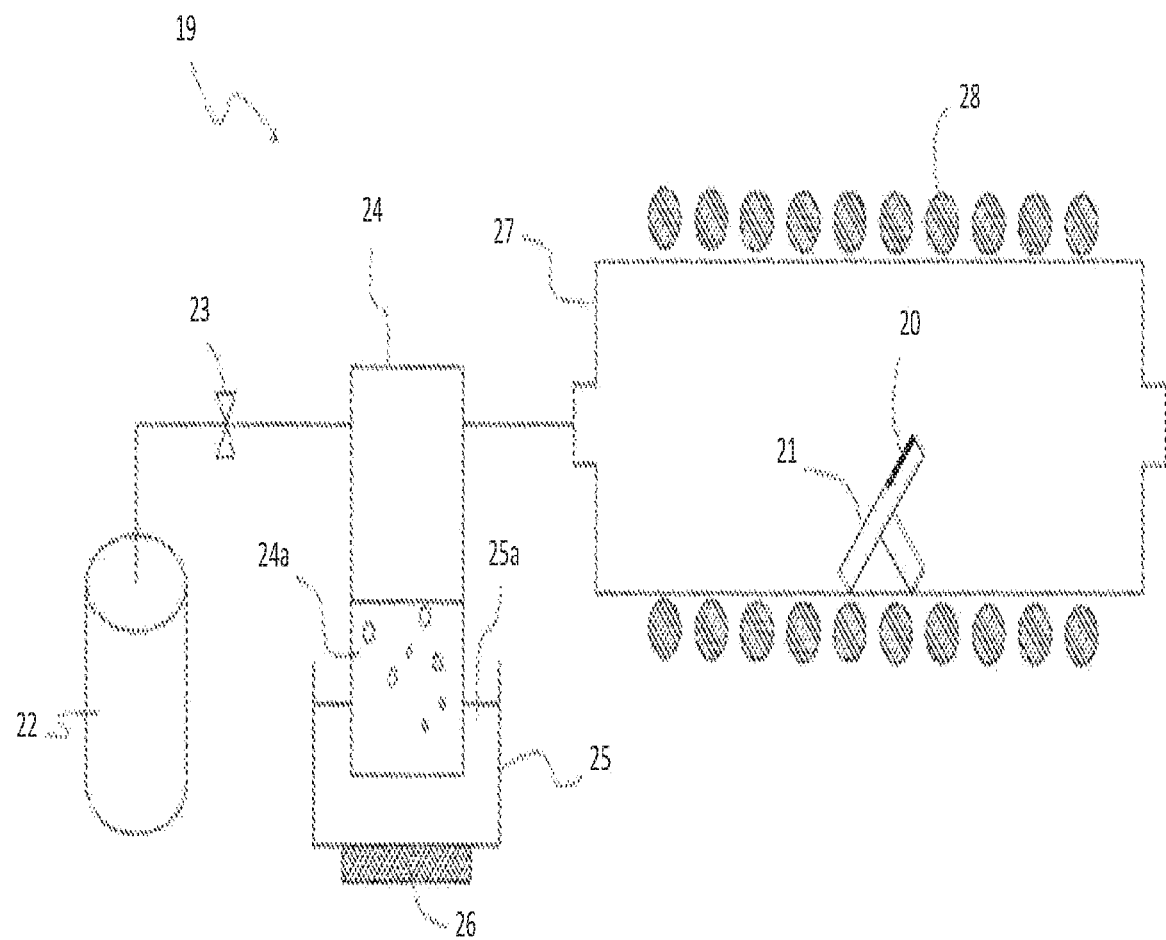
FIG. 18 is a configuration diagram of a mist CVD apparatus used in Example.

With reference to FIG. 18, a mist CVD apparatus 19 used in the present Example is described. The mist CVD apparatus 19 was provided with a susceptor 21 to place a substrate 20, carrier gas supply means 22 to supply a carrier gas, a flow regulating valve 23 to regulate a flow rate of the carrier gas discharged from the carrier gas supply means 22, a mist generator 24 to store a raw-material solution 24a, a container 25 to keep water 25a, an ultrasonic vibration transducer 26 mounted at a bottom of the container 25, a supply pipe 27 of a quartz pipe with an inner diameter of 40 mm, and a heater 28 placed surrounding the supply pipe 27. The susceptor 21 was made from quartz and had a surface to place the substrate 20 inclined from the horizontal plane. Both the supply pipe 27 and the susceptor 21 made from quartz inhibit mixing of impurities derived from the apparatus into the film formed on the substrate 20.

As the susceptor 21, the susceptor 51 illustrated in FIGS. 19A to 19B was used. The susceptor had a tilt angle of 45°, and the susceptor in the supply pipe was configured to have a total area of the substrate that, as illustrated in FIGS. 19A to 19B, gradually increased the susceptor region and gradually decreased the exhaust region. As illustrated in FIG. 20, the susceptor region was configured to be greater than the exhaust region.

2. Preparation of Raw-Material Solution

An aqueous solution of gallium bromide and germanium oxide was prepared at an atomic ratio of germanium to gallium of 1:0.05. At this point, a 48% hydrobromic acid solution was contained at a volume ratio of 10%. In Condition 1, the concentration of germanium oxide was $5.0 \times 10^{-3}$ mol/L.

The raw-material solution 24a was stored in the mist generator 24.

3. Film Formation Preparation

Then, on the susceptor 21, a c-plane sapphire substrate in a 10 mm square with a thickness of 600 μm was placed as the substrate 20. The heater 28 was activated to raise a temperature in the supply pipe 27 to 500° C. The flow regulating valve 23 was then opened to supply a carrier gas from the carrier gas supply means 22 into the supply pipe 27. After the carrier gas sufficiently substituted for the atmosphere in the supply pipe 27, the flow rate of the carrier gas was regulated at 5 L/min. As the carrier gas, an oxygen gas was used.

4. Film Formation

The ultrasonic vibration transducer 26 was then vibrated at 2.4 MHz. The vibration propagated through the water 25a to the raw-material solution 24a, thereby microparticulating the raw-material solution 24a to produce raw material microparticles.

The raw material microparticles were introduced to the supply pipe 27 by the carrier gas to be reacted in the supply pipe 27. A film was formed on the substrate 20 by the CVD reaction on the film formation surface of the substrate 20.

5. Evaluation

A phase of the film thus obtained was identified. The identification was carried out by 2θ/ω scanning at an angle from 15 to 95 degrees using an XRD diffractometer. The measurement was performed using CuK α rays. As a result, the crystalline semiconductor film thus obtained had a film thickness of 3.5 μm.

For evaluation of the electrical characteristics of the film thus obtained, the Hall effect was measured by the van der pauw method. The measurement environment was at room temperature and a frequency of the applied magnetic field at 50 mHz. As a result, the carrier concentration was $4.33 \times 10^{18}$ (1/cm$^2$) and the mobility was 19 (cm$^2$/V·s).

Example 2

Figure 21:
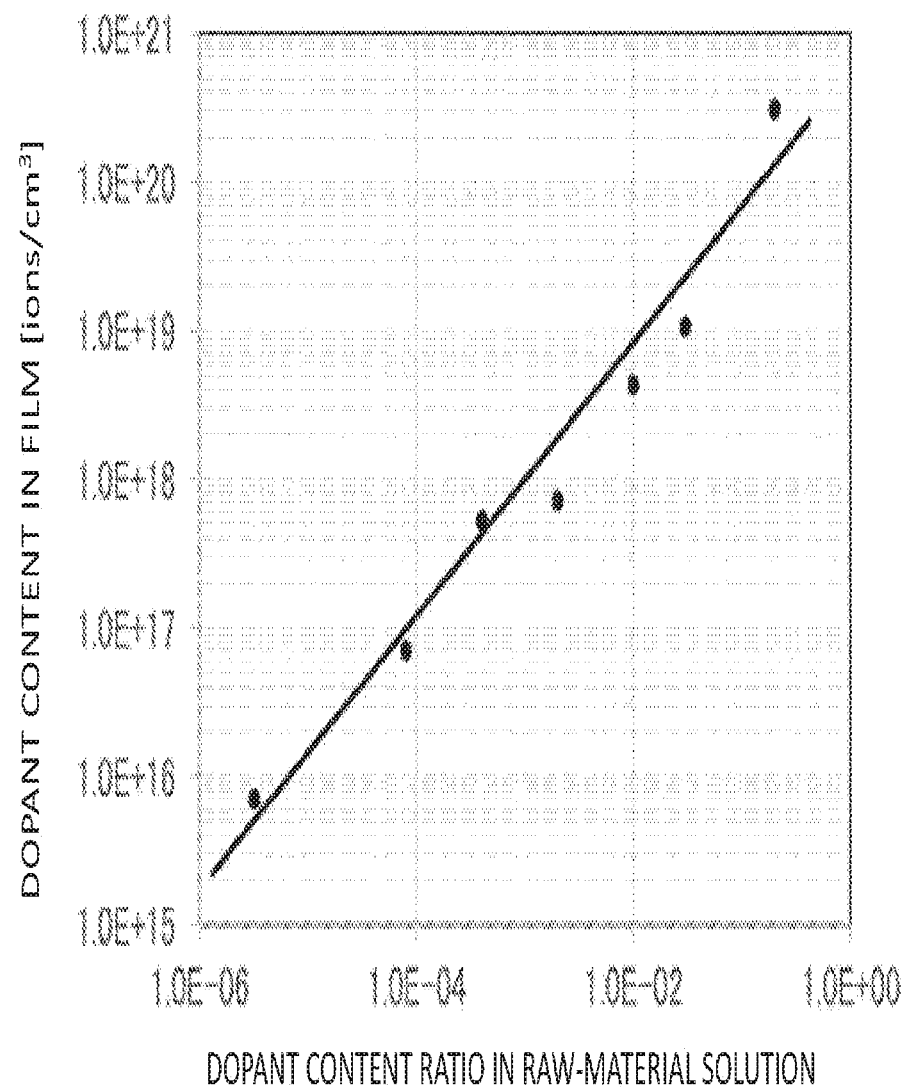
FIG. 21 is a graph illustrating relationship between a dopant content ratio in the liquid and a germanium content in the film in Example of the present invention.

Respective raw-material solutions of gallium bromide and germanium oxide were prepared at an atomic ratio of germanium to gallium of 1E-7, 1E-6, 8E-5, 4E-4, 2E-3, 1E-2, 2E-1, and 8E-1. At this point, a 48% hydrobromic acid solution was contained at a volume ratio of 10%. Films were formed in the film formation conditions same as those in Example 1 for quantitative analysis of the concentration of impurities using SIMS, the type of incident ion of oxygen, and output of 3 kV and 200 nA. The results are illustrated in FIG. 21. As illustrated in FIG. 21, it was found that a dopant content ratio in the liquid and a doping amount in the crystal film have a correlation and adjustment of the dopant content ratio in the liquid facilitates control of the doping concentration in the film to be formed.

Example 3

Figure 22:
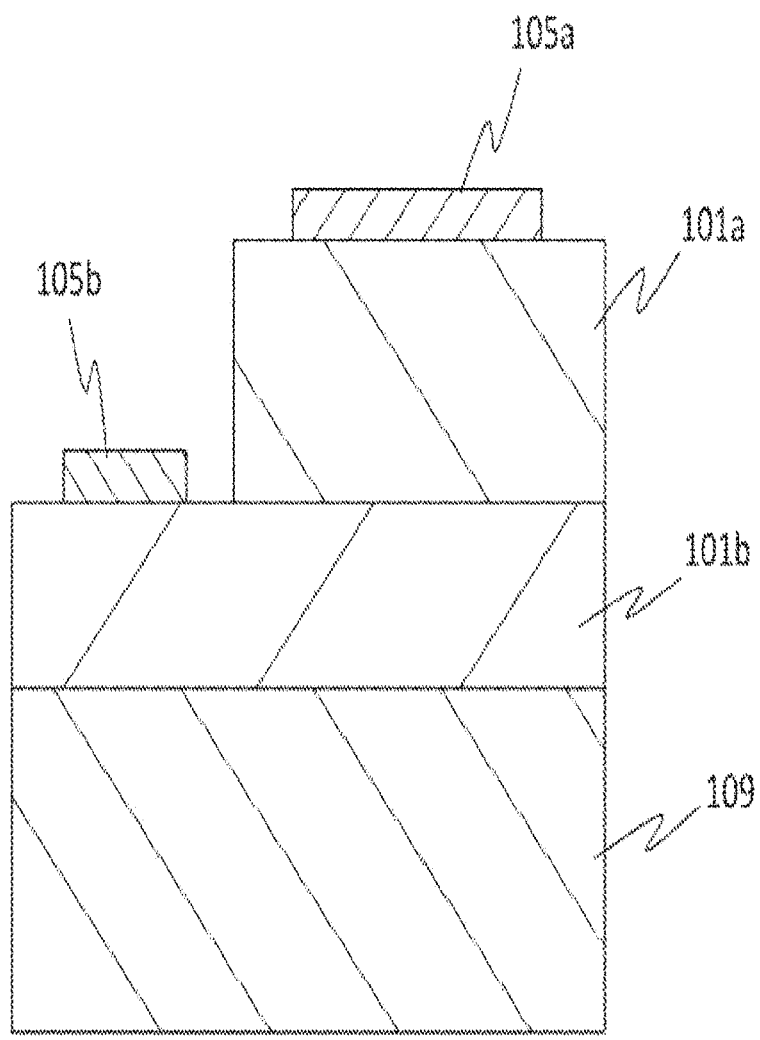
FIG. 22 is a diagram illustrating a structure of a Schottky barrier diode (SBD) in Example.

In the same manner as in Condition 1 other than changing the concentration of germanium oxide to $1.0 \times 10^{-3}$ mol/L instead of $5.0 \times 10^{-3}$ mol/L, a germanium doped α-Ga$_2$O$_3$ film was formed on the c-plane sapphire substrate as the n+ semiconductor layer. On the film thus formed, an undoped α-Ga$_2$O$_3$ film was then formed as the n− semiconductor layer. The n− semiconductor layer was formed in the same manner as above other than doping was not performed. The crystalline semiconductor film thus obtained had a film thickness of 7.6 μm and the film formation time was 180 minutes. Then, as illustrated in FIG. 22, part of the n− semiconductor layer 101a was etched, followed by providing the ohmic electrode 105b of Ti on the n+ semiconductor layer 101b and the Schottky electrode 105a on the n− semiconductor layer 101a by sputtering to fabricate an SBD.

Figure 23:
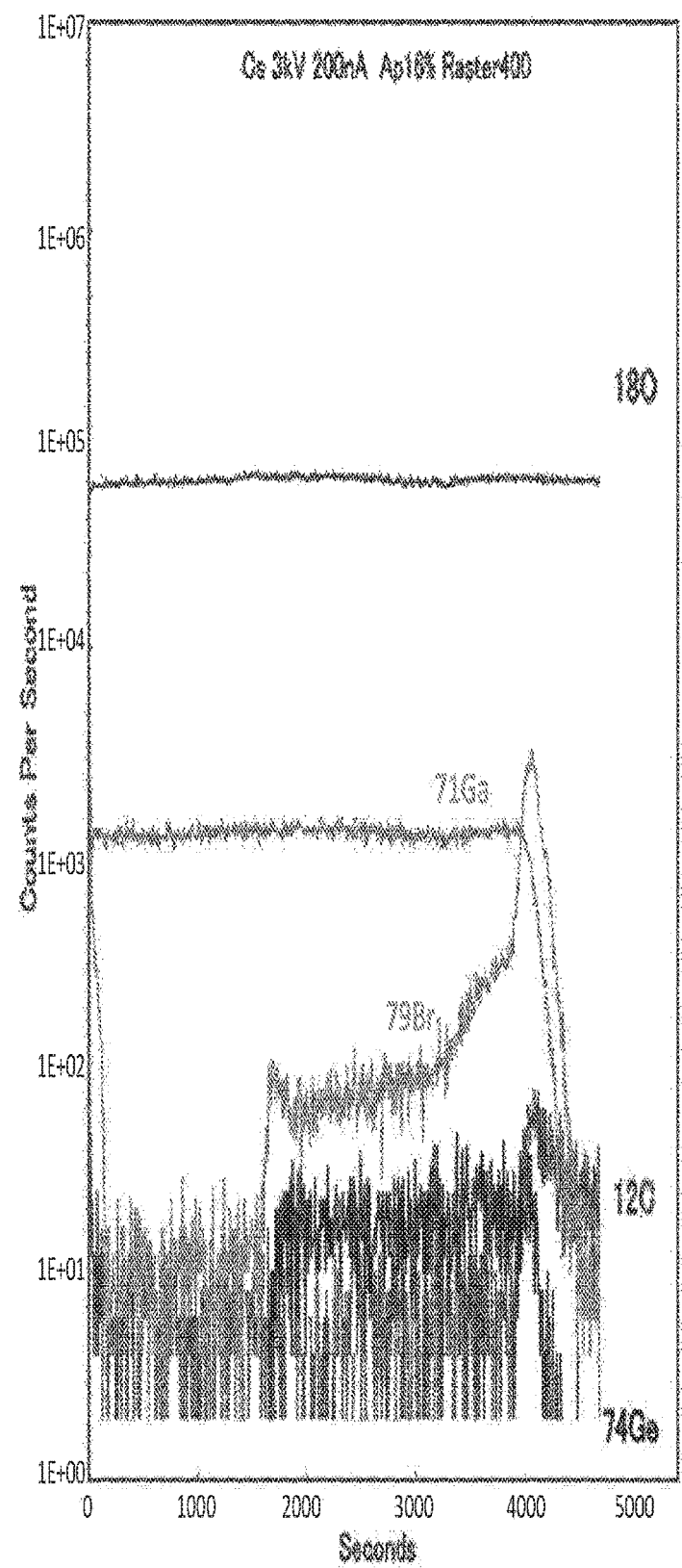
FIG. 23 is a diagram illustrating a result of SIMS analysis of a germanium doped semiconductor layer in Example.

The SBD thus obtained was subjected to SIMS analysis (Cs, 3 kV, 200 nA, Ap 16%, Raster 400). The results are illustrated in FIG. 23. As clearly seen from FIG. 23, germanium was not contained up to around 1500 seconds past in the sputtering time on the abscissa, and from 1500 seconds to 4000 seconds approximately, germanium was uniformly contained and the n+ type semiconductor layer and the n− type semiconductor layer were formed well.

Example 4

An aqueous solution of gallium bromide and tetraethyl orthosilicate was prepared at a ratio of an amount of substance of 100:1. At this point, a 48% hydrobromic acid solution was contained at a volume ratio of 10%. The concentration of silicon bromide was $1.0 \times 10^{-3}$ mol/L. In the conditions where a film formation temperature was 500° C., the carrier gas was nitrogen, and a flow rate was 5 L/min, a film was formed. The film was formed in the same manner as in Example 1 in the other film formation conditions. The film thus obtained was subjected to phase identification by 2θ/ω scanning at an angle from 15 to 95 degrees using an XRD diffractometer. The measurement was performed using CuK α rays. As a result, the film thus obtained was α-Ga$_2$O$_3$. The film had a thickness of 2.5 μm.

Figure 24:
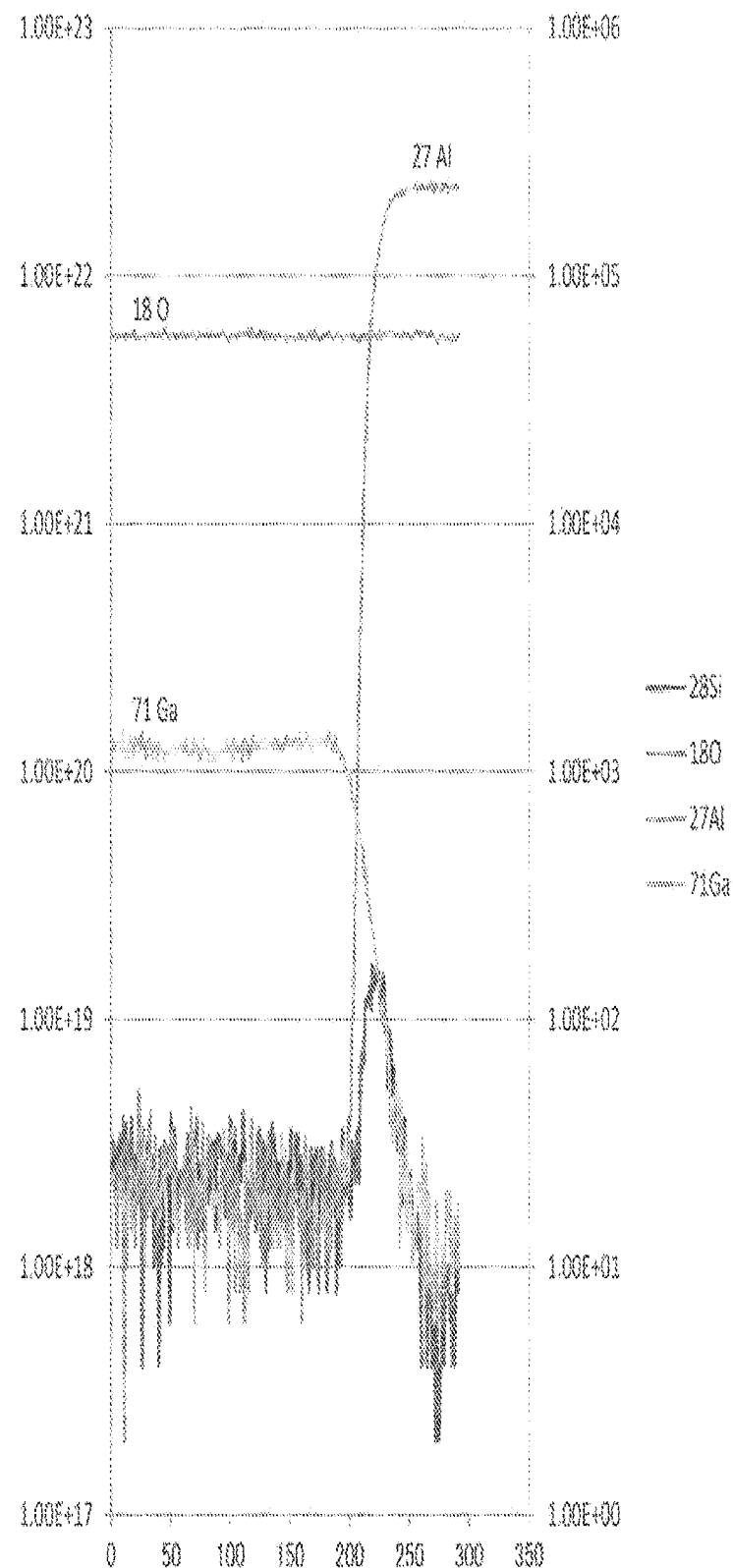
FIG. 24 is a diagram illustrating a result of SIMS analysis of a silicon doped semiconductor layer in Example.

The film thus obtained was subjected to SIMS analysis (Cs, 3 kV, 200 nA, Ap 16%, Raster 400). The results are illustrated in FIG. 24. It is found that silicon was doped well. germanium was not contained up to around 1500 seconds past in the sputtering time on the abscissa, and from 1500 seconds to 4000 seconds approximately, germanium was uniformly contained and the n+ type semiconductor layer and the n− type semiconductor layer were formed well. The electrical characteristics or the like exhibited performance equivalent to that in Example 1 where germanium is contained.

Example 5

A crystalline semiconductor film was formed in the same manner as in Example 3. After film formation, the crystalline semiconductor film was peeled off from the substrate due to ultrasonic vibration. The film thus obtained was subjected to phase identification by 2θ/ω scanning at an angle from 15 to 95 degrees using an XRD diffractometer. The measurement was performed using CuK α rays. As a result, the film thus obtained was α-Ga$_2$O$_3$. The film had a thickness of 7.6 μm, and the film formation time was 180 minutes.

Figure 25:
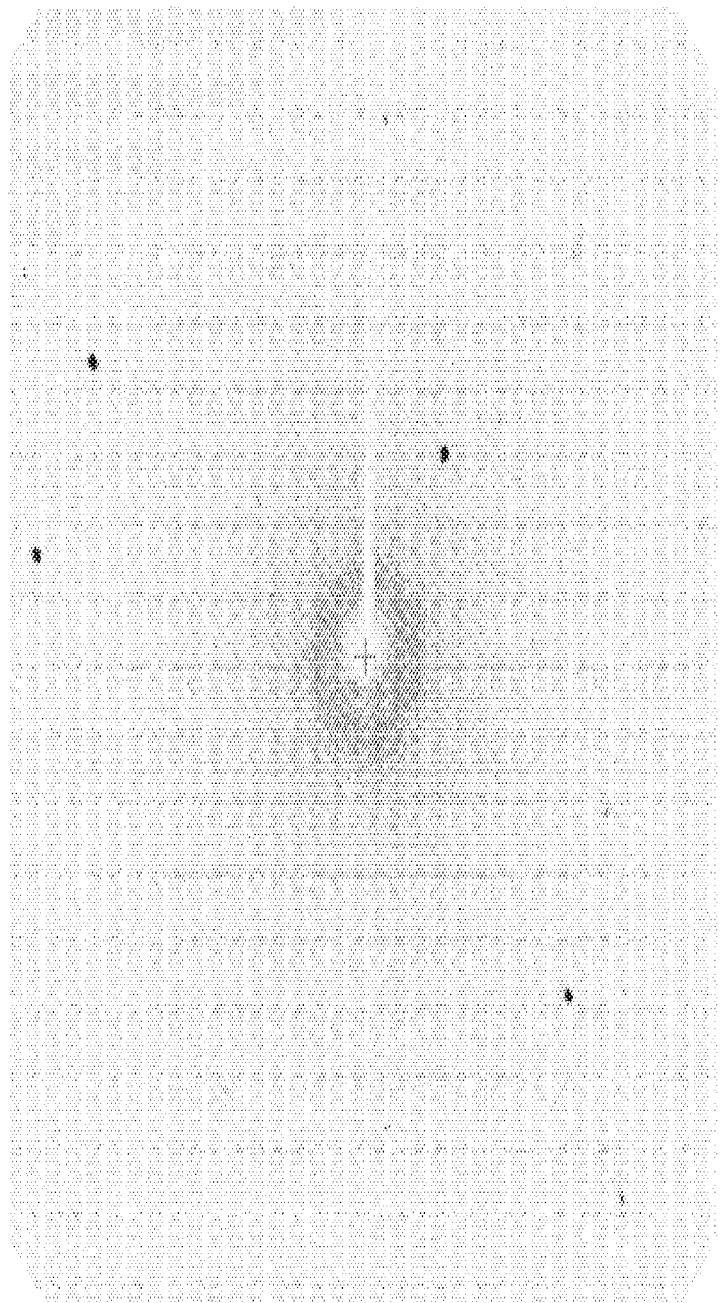
FIG. 25 is a diagram illustrating an X-ray diffraction image of a free-standing film obtained in Example.

The free-standing film thus obtained was subjected to structure evaluation using an X-ray diffractometer. As a result of X-ray diffraction, FIG. 25 illustrates an X-ray diffraction image. As clearly seen from FIG. 25, there is no diffraction spot for the substrate and thus the film is understood as a free-standing film.

Example 6

Figure 26:
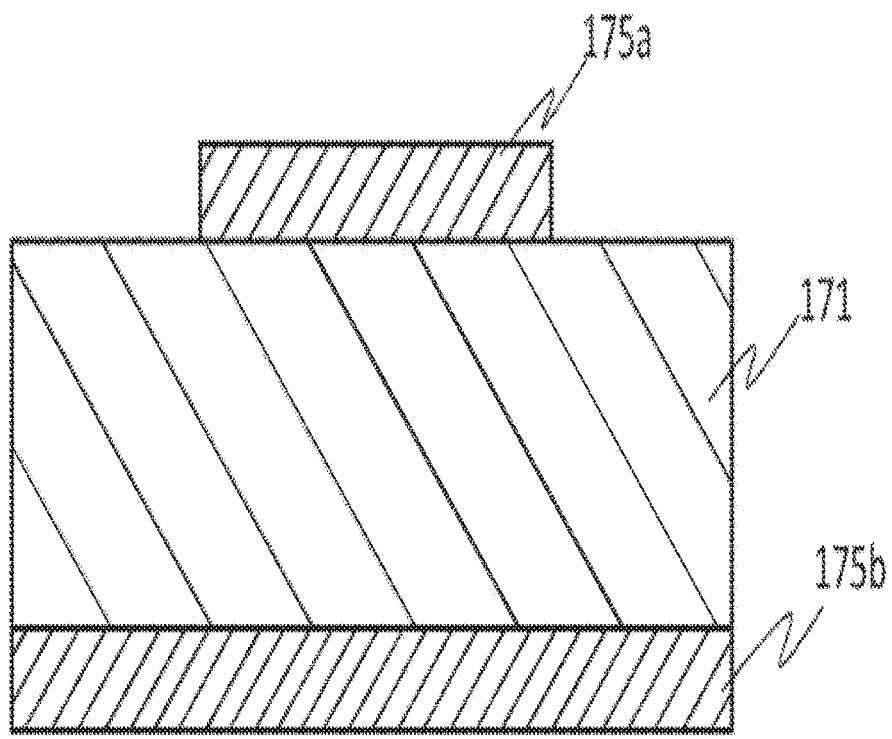
FIG. 26 is a diagram illustrating a structure of another Schottky barrier diode (SBD) in Example.
Figure 27:
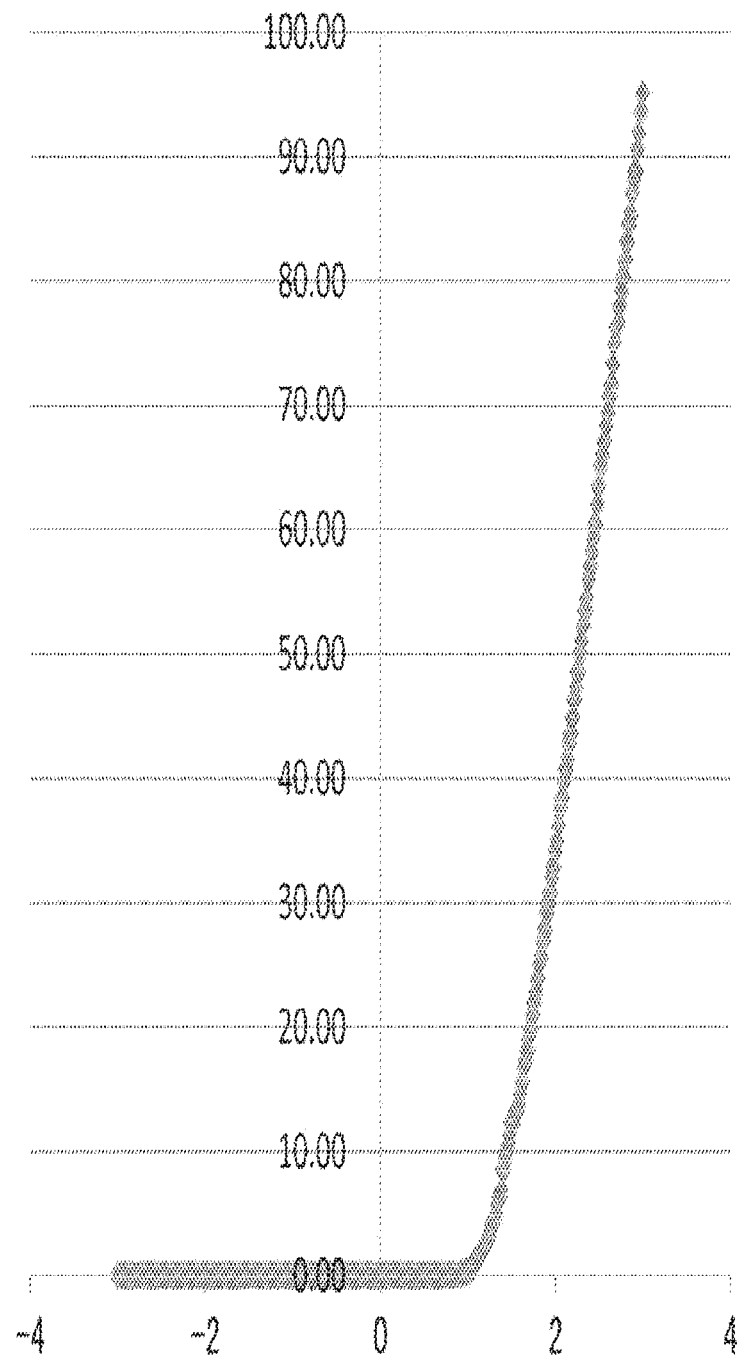
FIG. 27 is a diagram illustrating current-voltage characteristics of an SBD obtained in Example.

As illustrated in FIG. 26, from a free-standing film 171 obtained in Example 5, an SBD was fabricated using tungsten as a Schottky electrode 175a and indium as an ohmic electrode 175b. The SBD thus obtained was subjected to current-voltage characteristics evaluation. The results are illustrated in FIG. 27.

Example 7

In the same manner as in Example 1, a crystalline semiconductor film was formed for a long formation time. The film thus obtained was subjected to phase identification by 2θ/ω scanning at an angle from 15 to 95 degrees using an XRD diffractometer. The measurement was performed using CuK α rays. As a result, the film thus obtained was α-Ga$_2$O$_3$. The film had a thickness of 50 μm, and the film thickness of 50 μm resulted in no longer a film but sheet-like.

Example 8

Figure 28:
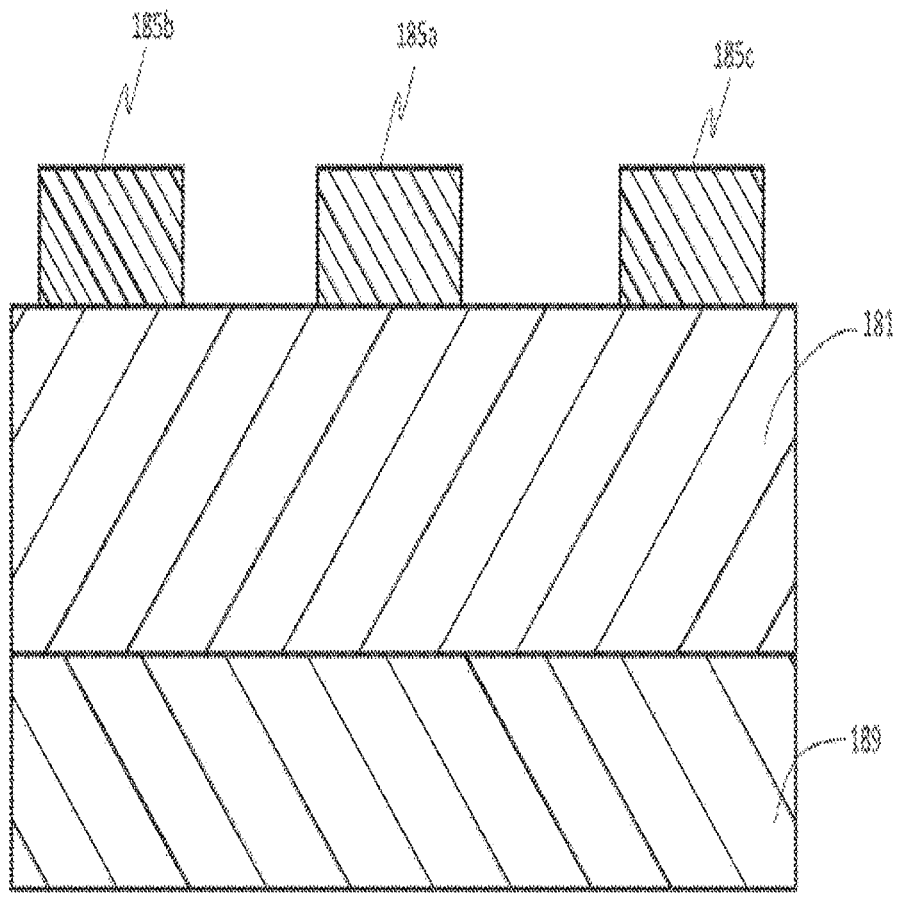
FIG. 28 is a diagram illustrating a structure of an MESFET fabricated in Example.
Figure 29:
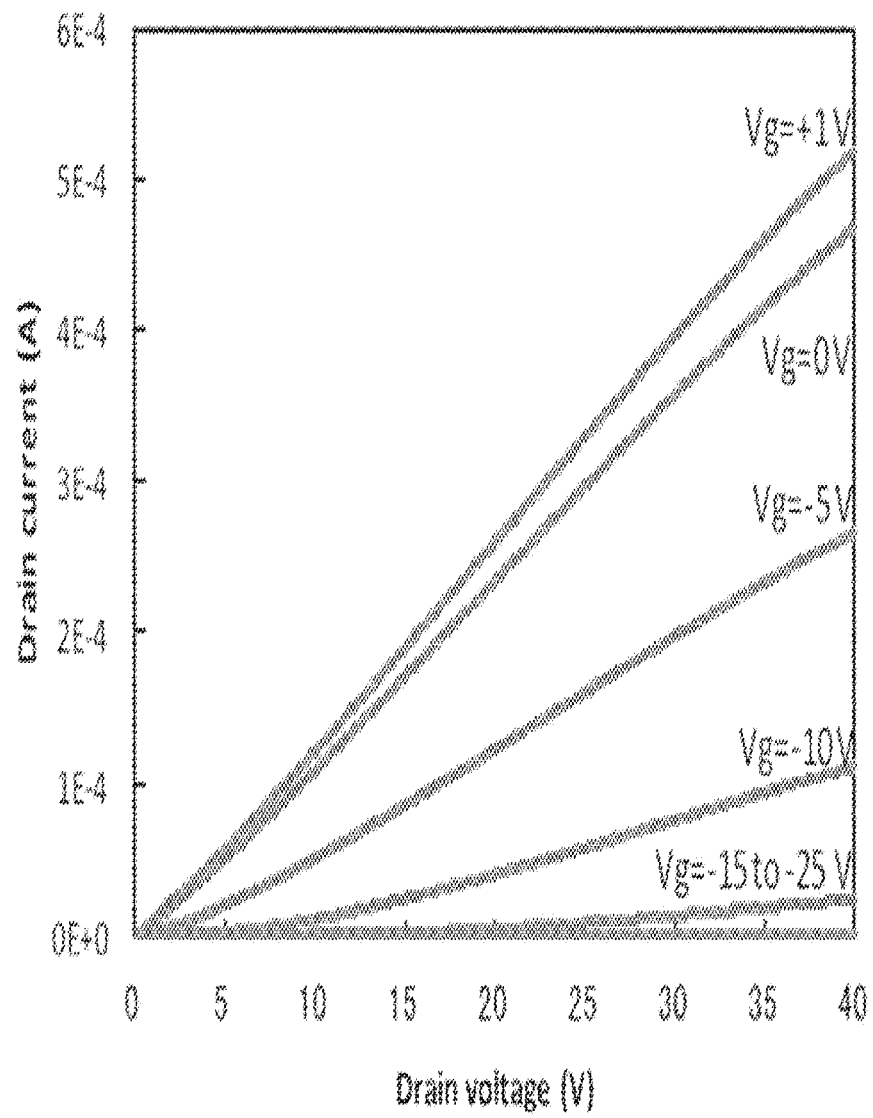
FIG. 29 is a diagram illustrating DC characteristics of the MESFET fabricated in Example, where the ordinate represents a drain current (A) and the abscissa represents a drain voltage (V).

In the same manner as in Example 1, a crystalline semiconductor film was formed. The film thus obtained was subjected to phase identification by 2.theta./.omega. scanning at an angle from 15 to 95 degrees using an XRD diffractometer. The measurement was performed using CuK α rays. As a result, the film thus obtained was α-Ga$_2$O$_3$. The film had a thickness of 1.9 μm. Directly using the film thus obtained, as illustrated in FIG. 28, a MESFET was fabricated. The MESFET in FIG. 28 was provided with a gate electrode 185a, a source electrode 185b, a drain electrode 185c, an n type semiconductor layer 181, and a substrate 189. The n type semiconductor layer 181 was α-Ga$_2$O$_3$, where the gate electrode 185a was made from platinum (Pt) and the source electrode 185b and the drain electrode 185c were formed from titanium (Ti)-gold (Au) alloy. FIG. 29 illustrates the DC characteristics of the MESFET thus fabricated. As clearly seen from FIG. 29, almost no leakage current was found, and particularly, a result of approximately 0.5 nA at a gate voltage of −25 V was obtained. The current reached 519 μA at a gate voltage of 1 V, so that the on-off ratio was a relatively high value of $10^6$.

Example 9

9-1. Film Formation Apparatus

Figure 30:
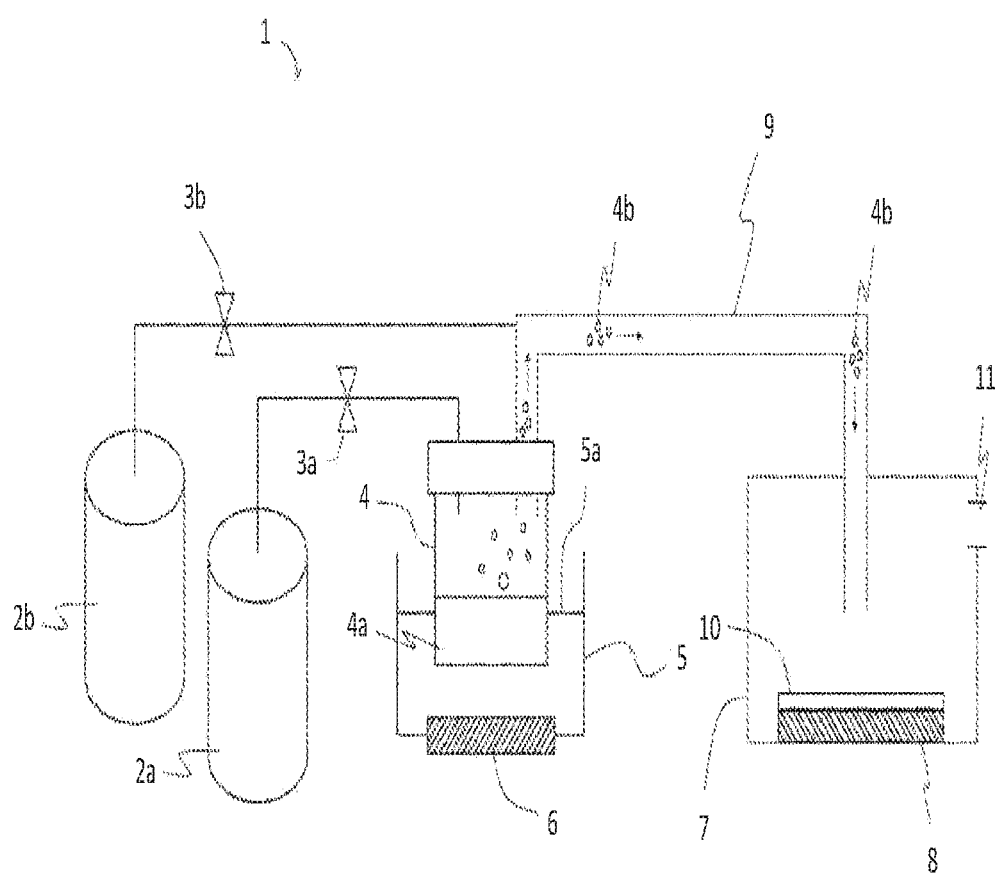
FIG. 30 is a schematic block diagram of a mist CVD apparatus used in Examples.

With reference to FIG. 30, a mist CVD apparatus 1 used in the present Example is described. The mist CVD apparatus 1 was provided with a carrier gas source 2a to supply a carrier gas, a flow regulating valve 3a to regulate a flow rate of the carrier gas discharged from the carrier gas source 2a, a dilution carrier gas source 2b to supply a dilution carrier gas, a flow regulating valve 3b to regulate a flow rate of the dilution carrier gas discharged from the dilution carrier gas source 2b, a mist generator 4 to store a raw-material solution 4a, a container 5 to keep water 5a, an ultrasonic vibration transducer 6 mounted at a bottom of the container 5, a film formation chamber 7, a supply pipe 9 connecting the mist generator 4 to the film formation chamber 7, a hot plate 8 placed in the film formation chamber 7, and an exhaust outlet 11 to exhaust mist, droplets, and exhaust gas after thermal reaction. On the hot plate 8, a substrate 10 was placed.

9-2. Preparation of Raw-Material Solution

Gallium bromide and germanium oxide were mixed to water to prepare an aqueous solution at an atomic ratio of germanium to gallium of 1:0.01. At this point, hydrobromic acid was contained at a volume ratio of 10% to make a raw-material solution.

9-3. Film Formation Preparation

The raw-material solution 4a obtained in 2. above was stored in the mist generator 4. Then, a 4-inch sapphire substrate was placed on the hot plate 8 as the substrate 10. The hot plate 8 was activated to raise a temperature in the film formation chamber 7 to 550° C. The flow regulating valves 3a and 3b were then opened to supply a carrier gas from carrier gas supply means 2a and 2b as the carrier gas sources into the film formation chamber 7. After the carrier gas sufficiently substituted for the atmosphere in the film formation chamber 7, the flow rate of the carrier gas was regulated at 5.0 L/min. and the flow rate of the dilution carrier gas was regulated at 0.5 L/min. As the carrier gas, oxygen was used.

9-4. Film Formation

The ultrasonic vibration transducer 6 was then vibrated at 2.4 MHz. The vibration propagated through the water 5a to the raw-material solution 4a, thereby atomizing the raw-material solution 4a to produce mist 4b. The mist 4b was introduced to the film formation chamber 7 through the supply pipe 9 by the carrier gas. The mist was thermally reacted in the film formation chamber 7 at 550° C. under atmospheric pressure to form an n+ layer on the substrate 10. As the second layer, an n⁻ layer was formed using a raw-material solution same as that for the first layer other than not using germanium oxide and in the conditions same as those in the first layer. The film formation time was 4 hours and 30 minutes.

In addition, using the mist CVD apparatus in FIG. 18, the second layer was regrown in the conditions same as above. The film formation time was 120 minutes. The crystalline semiconductor film had a film thickness of 11.9 μm in total, where the n+ layer had a film thickness of 3.8 μm and the n⁻ layer had a film thickness of 8.1 μm. The phases of the films thus obtained were identified using an XRD diffractometer, and all the films thus obtained were α-Ga$_2$O$_3$.

9-5. Electrode Formation

After the sapphire substrate was peeled off from the α-Ga$_2$O$_3$ film, gold as a Schottky electrode and Ti/Au as an ohmic electrode were formed by the vapor deposition, respectively on the n⁻ layer and the n⁺ layer to fabricate an SBD.

9-6. Evaluation

Figure 31:
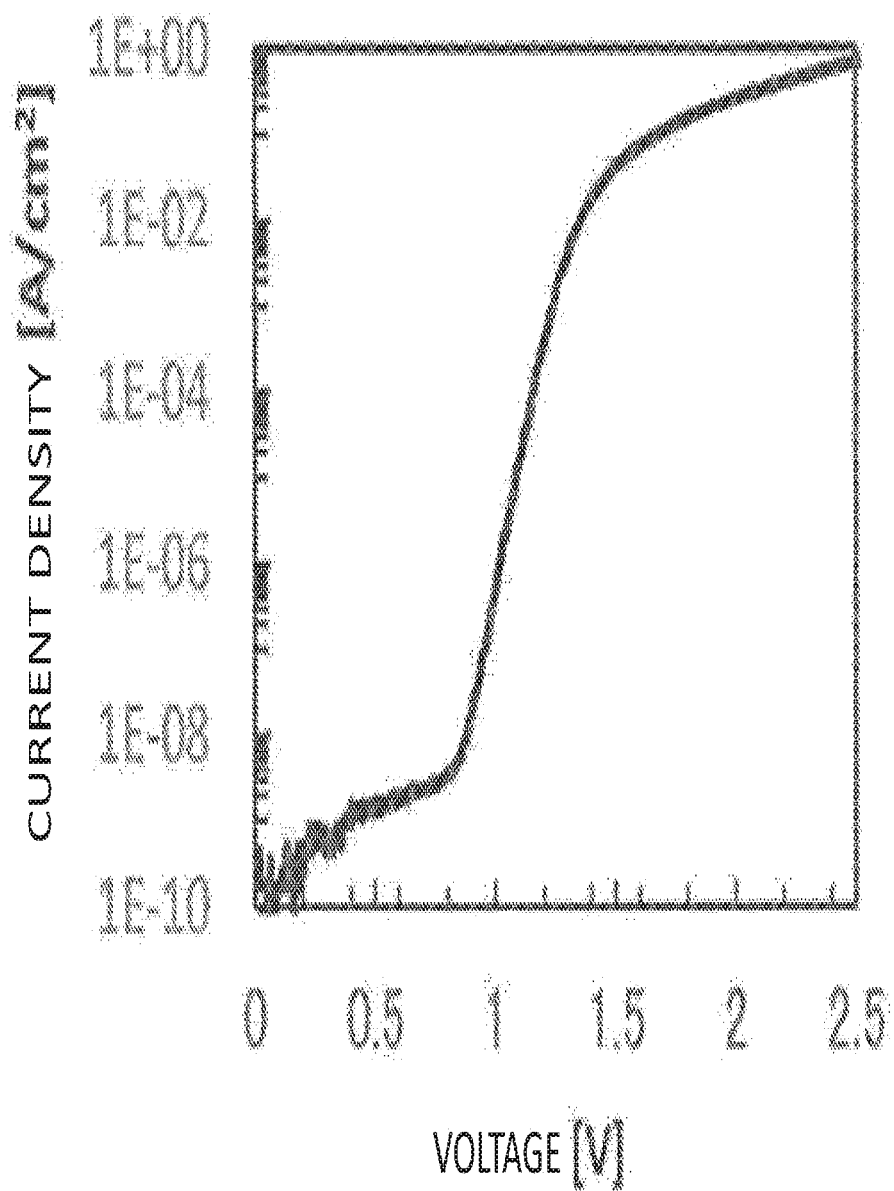
FIG. 31 is a diagram illustrating results of forward current-voltage characteristics evaluation in Example.
Figure 32:
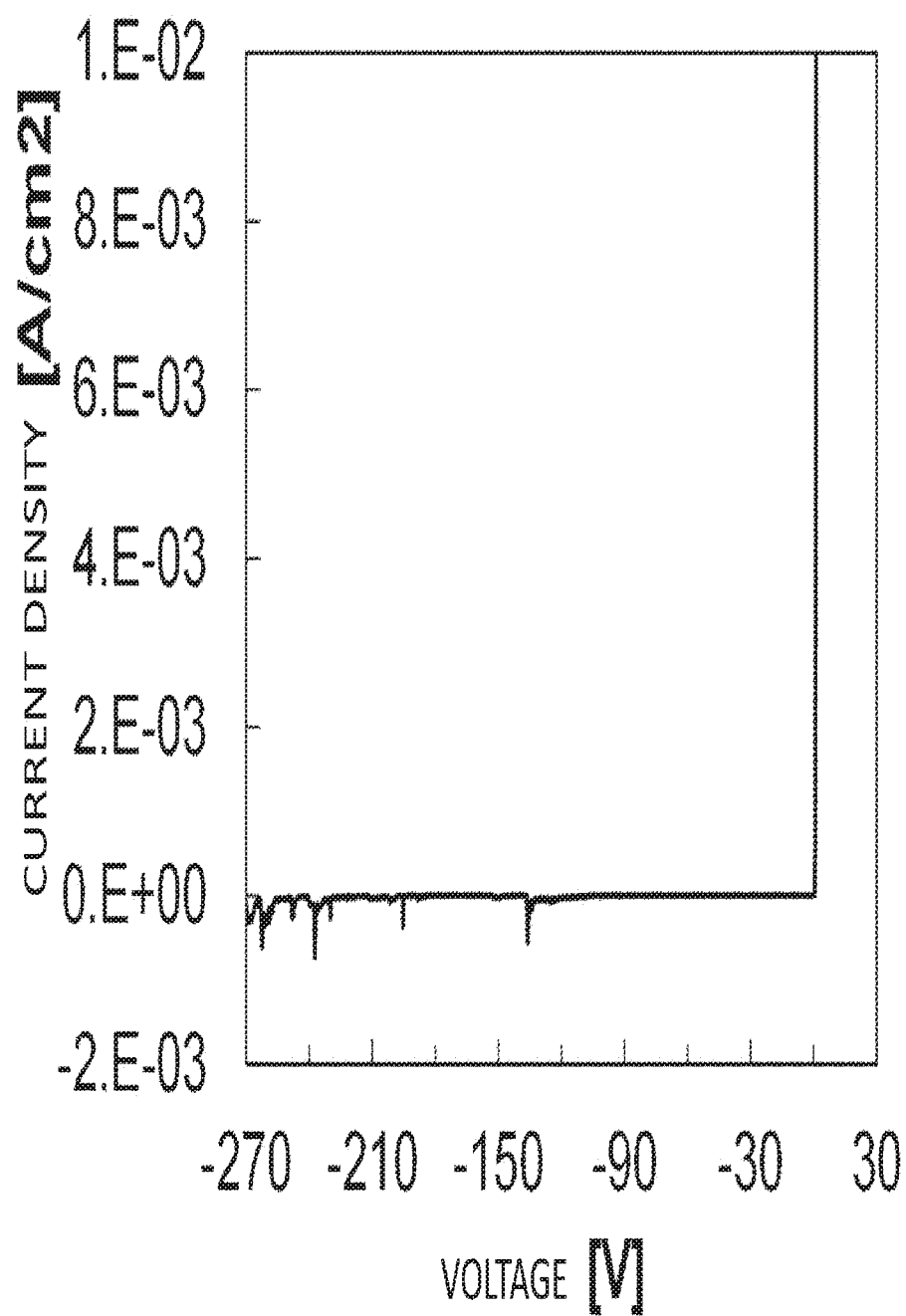
FIG. 32 is a diagram illustrating results of reverse current-voltage characteristics evaluation in Example.

The SBD thus obtained was subjected to current-voltage characteristics evaluation. FIG. 31 illustrates the results in a forward direction, and FIG. 32 illustrates the results in a reverse direction. As clearly seen from the results, the electrical characteristics of the semiconductor were excellent, and particularly, the withstand voltage in the reverse bias was more than 300 V. It is thus found that the product of the present invention has good diode characteristics.

Example 10

10-1. Film Formation Apparatus

In the same manner as in Example 9, the film formation apparatus illustrated in FIG. 30 was used.

10-2. Preparation of Raw-Material Solution (for Buffer Layer)

Hydrochloric acid was contained at a volume ratio of 1.5% in a 0.05 M aqueous iron-acetyl acetylacetonato solution to make a raw-material solution for a buffer layer.

10-3. Film Formation Preparation

The raw-material solution 4a for a buffer layer obtained in 10-2. above was stored in the mist generator 4. A sapphire substrate was then placed on the hot plate 8 as the substrate 10. The hot plate 8 was activated to raise a temperature of the heater to 550° C. The flow regulating valves 3a and 3b were then opened to supply a carrier gas from the carrier gas supply means 2a and 2b as the carrier gas sources into the film formation chamber 7. After the atmosphere in the film formation chamber 7 was sufficiently purged with the carrier gas, the flow rate of the carrier gas was regulated at 2.0 L/min. and the flow rate of the dilution carrier gas was regulated at 0.5 L/min. As the carrier gas, nitrogen was used.

10-4. Formation of Buffer Layer

The ultrasonic vibration transducer 6 was then vibrated at 2.4 MHz. The vibration propagated through the water 5a to the raw-material solution 4a, thereby atomizing the raw-material solution 4a to produce mist 4b. The mist 4b was introduced to the film formation chamber 7 through the supply pipe 9 by the carrier gas. The mist 4b was thermally reacted in the film formation chamber 7 at 550° C. under atmospheric pressure to form a buffer layer on the substrate 10. The film formation time was 30 minutes.

10-5. Preparation of Raw-Material Solution

A 0.05 M aqueous gallium bromide solution was prepared. At this point, hydrobromic acid was contained at a volume ratio of 20% and tin bromide was further added at 8 atom % of tin to gallium to make a raw-material solution.

10-6. Film Formation Preparation

The raw-material solution 4a obtained in 10-5. above was stored in the mist generator 4. A sapphire substrate with a buffer layer was then placed on the hot plate 8 as the substrate 10. The hot plate 8 was activated to raise a temperature of the heater to 500° C. The flow regulating valves 3a and 3b were then opened to supply a carrier gas from the carrier gas supply means 2a and 2b as the carrier gas sources into the film formation chamber 7. After the atmosphere in the film formation chamber 7 was sufficiently purged with the carrier gas, the flow rate of the carrier gas was regulated at 1.0 L/min. and the flow rate of the dilution carrier gas was regulated at 0.5 L/min. As the carrier gas, a forming gas ($H_2:N_2=5:95$) was used.

10-7. Film Formation

The ultrasonic vibration transducer 6 was then vibrated at 2.4 MHz. The vibration propagated through the water 5a to the raw-material solution 4a, thereby atomizing the raw-material solution 4a to produce mist 4b. The mist 4b was introduced to the film formation chamber 7 through the supply pipe 9 by the carrier gas. The mist 4b was thermally reacted in the film formation chamber 7 at 550° C. under atmospheric pressure to form a buffer layer on the substrate 10. The film formation time was 300 minutes.

10-8. Peeled Film

Figure 33:
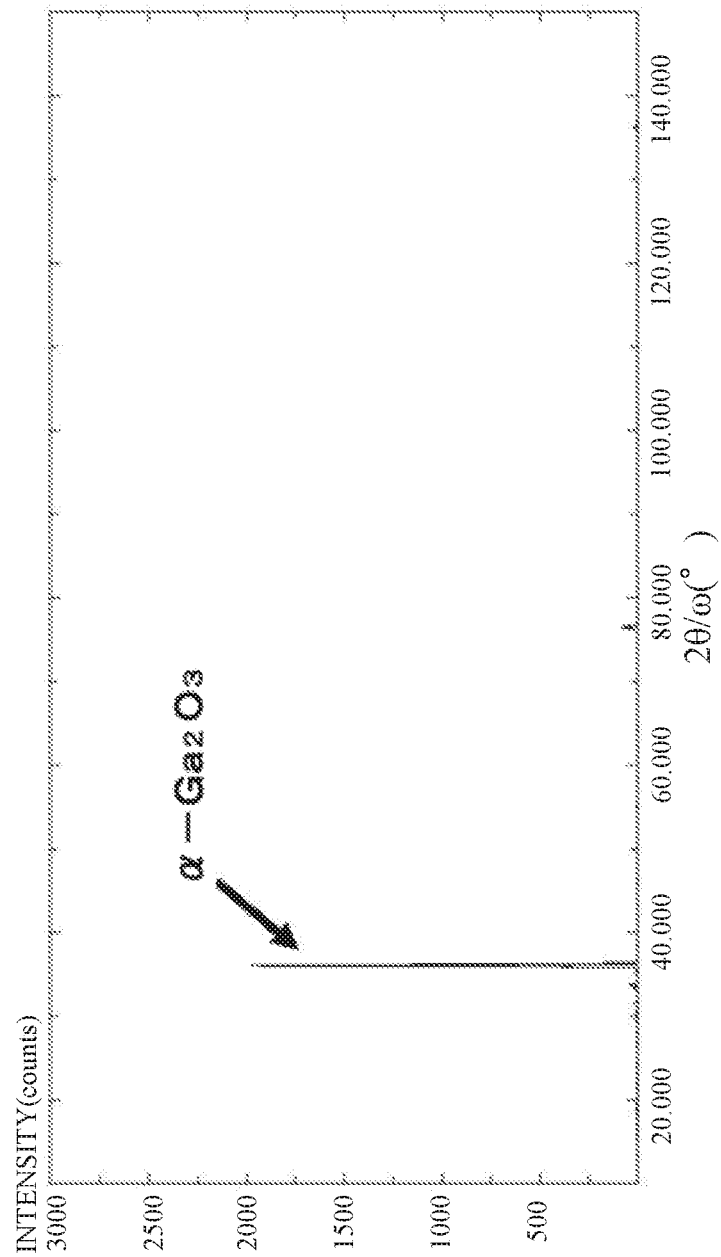
FIG. 33 is a diagram illustrating results of XRD in Example.
Figure 34:
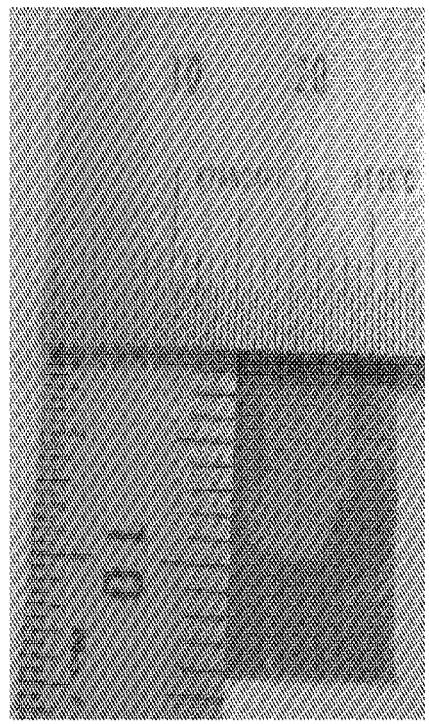
FIG. 34 illustrates a photograph of a film in Example.
Figure 35:
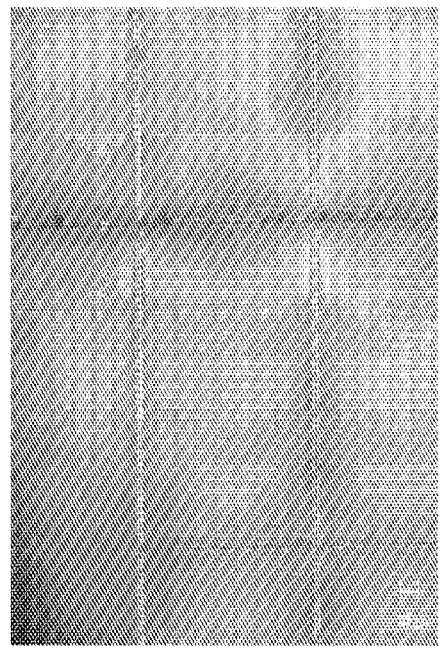
FIG. 35 illustrates another photograph of a film in Example.

The buffer layer was dissolved by concentrated hydrochloric acid to peel off the film obtained in 10-4. above from the substrate. The film thus obtained had a film thickness of 4 μm. The film was identified using an X-ray diffractometer as $\alpha\text{-}Ga_2O_3$. FIG. 33 illustrates the results of XRD. As clearly seen from FIG. 33, there are no peak of the sapphire substrate and no peak of the buffer layer to find that the film was a clean peeled film of $\alpha\text{-}Ga_2O_3$. The $\alpha\text{-}Ga_2O_3$ film thus obtained was cut out to 1 mm square using a laser. FIG. 34 illustrates a photograph of the $\alpha\text{-}Ga_2O_3$ film before cut out, and FIG. 35 illustrates the $\alpha\text{-}Ga_2O_3$ film after cut out. As clearly seen from FIG. 34, the peeled film thus obtained had a film surface area of 5 mm square or more. As clearly seen from FIG. 35, the $\alpha\text{-}Ga_2O_3$ film of good quality in 1 mm square was cut out.

INDUSTRIAL APPLICABILITY

The crystalline semiconductor film and the sheet like object of the present invention can be used in any field, such as semiconductors (e.g., compound semiconductor electronic devices, etc.), electronic components and electric device components, optical and electronic photography related devices, and industrial components. They are excellent in semiconductor properties and particularly useful for semiconductor devices.

REFERENCE SIGNS LIST

1 Mist CVD Apparatus
2a Carrier Gas Source
2b Dilution Carrier Gas Source
3a Flow Regulating Valve
3b Flow Regulating Valve
4 Mist Generator
4a Raw-Material Solution
4b Mist
5 Container
5a Water
6 Ultrasonic Vibration Transducer
7 Film Formation Chamber
8 Hot Plate
9 Supply Pipe
10 Substrate
11 Exhaust Outlet
19 Mist CVD Apparatus
20 Substrate
21 Susceptor
22 Carrier Gas Supply Means
23 Flow Regulating Valve
24 Mist Generator
24a Raw-Material Solution
25 Container
25a Water
26 Ultrasonic Vibration Transducer
27 Film Formation Chamber
28 Heater
51 Susceptor
52 Mist Acceleration Means
53 Substrate Holder
54 Support Unit
55 Supply Pipe
61 Substrate-Susceptor Region
62 Exhaust Region
101a n− Type Semiconductor Layer
101b n+ Type Semiconductor Layer
102 p Type Semiconductor Layer
103 Semi-Insulating Layer
104 Insulating Layer
105a Schottky Electrode
105b Ohmic Electrode 109 Substrate
111a n− Type Semiconductor Layer
111b n+ Type Semiconductor Layer
114 Semi-Insulating Layer
115a Gate Electrode
115b Source Electrode
115c Drain Electrode
118 Buffer Layer
121a n Type Semiconductor Layer with Wide Band Gap
121b n Type Semiconductor Layer with Narrow Band Gap
121c n+ Type Semiconductor Layer
123 p Type Semiconductor Layer
124 Semi-Insulating Layer
125a Gate Electrode
125b Source Electrode
125c Drain Electrode
128 Buffer Layer
129 Substrate
131a n− Type Semiconductor Layer
131b First n+ Type Semiconductor Layer
131c Second n+ Type Semiconductor Layer
132 p Type Semiconductor Layer
134 Gate Insulating Film
135a Gate Electrode
135b Source Electrode
135c Drain Electrode
138 Buffer Layer
139 Semi-Insulating Layer
141a n− Type Semiconductor Layer
141b First n+ Type Semiconductor Layer
141c Second n+ Type Semiconductor Layer
142 p Type Semiconductor Layer
145a Gate Electrode
145b Source Electrode
145c Drain Electrode
151 n Type Semiconductor Layer
151a n− Type Semiconductor Layer
151b n+ Type Semiconductor Layer
152 p Type Semiconductor Layer
154 Gate Insulating Film
155a Gate Electrode
155b Emitter Electrode
155c Collector Electrode
161 n Type Semiconductor Layer
162 p Type Semiconductor Layer
163 Light Emitting Layer
165a First Electrode
165b Second Electrode
167 Translucent Electrode
169 Substrate
171 α-Ga$_2$O$_3$ layer
175a Tungsten Electrode
175b Indium Electrode
181 n Type Semiconductor Layer
185a Gate Electrode
185b Source Electrode
185c Drain Electrode
189 Substrate

The invention claimed is:

1. A semiconductor device comprising:
a crystalline semiconductor film that comprises a corundum structured oxide semiconductor as a major component, the corundum structured oxide semiconductor that comprises an oxide comprising gallium and/or indium, and a thickness of the crystalline semiconductor film that is 1 μm or more;
a Schottky electrode, the Schottky electrode that is arranged on the crystalline semiconductor film; and
wherein the semiconductor device further has a diode structure.

2. The semiconductor device of claim 1,
wherein the thickness of the crystalline semiconductor film is 7.6 μm or more.

3. The semiconductor device of claim 1,
wherein the crystalline semiconductor film includes a dopant.

4. The semiconductor device of claim 1,
wherein a surface area of the crystalline semiconductor film is 9 mm$^2$ or more.

5. The semiconductor device of claim 1,
wherein the corundum structured oxide semiconductor further includes a metal selected from among Al, Fe, Cr, V, Rh, Ni and Co.

6. The semiconductor device of claim 1,
wherein the crystalline semiconductor film includes gallium at an atomic ratio of 0.5 or more in the metal elements included in the crystalline semiconductor film.

7. The semiconductor device of claim 1, further including:
an Ohmic electrode,
wherein the Ohmic electrode is arranged on the crystalline semiconductor film.

8. The semiconductor device of claim 7,
wherein the Schottky electrode is arranged at a first side of the crystalline semiconductor film, and the Ohmic electrode is arranged at a second side of the crystalline semiconductor film,
wherein the second side is an opposite side to the first side.

9. The semiconductor device of claim 1,
wherein the crystalline semiconductor film includes a first layer and a second layer, and wherein the first layer is an n− type semiconductor layer and the second layer is an n+ type semiconductor layer.

10. The semiconductor device of claim 1, further including:
an insulating layer, and
at least a part of the insulating layer is arranged between the crystalline semiconductor film and the Schottky electrode.

11. The semiconductor device of claim 1,
wherein the semiconductor device is a vertical device.

12. The semiconductor device of claim 1,
wherein the semiconductor device is a diode.

13. A semiconductor device comprising:
a crystalline semiconductor film that comprises a corundum structured oxide semiconductor as a major component, the corundum structured oxide semiconductor that comprises an oxide comprising gallium and/or indium, and a thickness of the crystalline semiconductor film that is 1 μm or more;
a Schottky electrode that is arranged on the crystalline semiconductor film,
the Schottky electrode that comprises at least one selected from among Al, Mo, Co, Zr, Sn, Nb, Fe, Cr, Ta, Ti, Au, Pt, V, Mn, Ni, Cu, Hf, W, Ir, Zn, In, Pd, Nd, and Ag, and alloys thereof, tin oxide, zinc oxide, indium oxide, indium tin oxide (ITO), and indium zinc oxide (IZO), polyaniline, polythiophene, and polypyrrole, and mixture thereof; and
wherein the semiconductor device further has a diode structure.

14. The semiconductor device of claim 13,
wherein the Schottky electrode includes at least one selected from among Al, Mo, Co, Zr, Sn, Nb, Fe, Cr, Ta, Ti, Au, Pt, V, Mn, Ni, Cu, Hf, W, Ir, Zn, In, Pd, Nd, Ag, and alloys thereof.

15. The semiconductor device of claim 13,
wherein the corundum structured oxide semiconductor further includes a metal selected from among Al, Fe, Cr, V, Rh, Ni and Co.

16. The semiconductor device of claim 13,
wherein the crystalline semiconductor film includes gallium at an atomic ratio of 0.5 or more in the metal elements included in the crystalline semiconductor film.

17. The semiconductor device of claim 13,
wherein the crystalline semiconductor film includes a first layer and a second layer, and wherein the first layer is an n− type semiconductor layer and the second layer is an n+ type semiconductor layer.

18. The semiconductor device of claim 13,
wherein a surface area of the crystalline semiconductor film is 9 $mm^2$ or more.

19. The semiconductor device of claim 13, further including:
an Ohmic electrode,
wherein the Ohmic electrode is arranged on the crystalline semiconductor film.

20. The semiconductor device of claim 19,
wherein the Schottky electrode is arranged at a first side of the crystalline semiconductor film, and the Ohmic electrode is arranged at a second side of the crystalline semiconductor film, and
wherein the second side is an opposite side to the first side.

* * * * *